(12) United States Patent
Park et al.

(10) Patent No.: US 11,812,555 B2
(45) Date of Patent: Nov. 7, 2023

(54) OVERLAPPING PRINTED CIRCUIT BOARDS AND ELECTRONIC DEVICE INCLUDING SAME

(71) Applicant: Samsung Electronics Co., Ltd., Suwon-si (KR)

(72) Inventors: Jinyong Park, Suwon-si (KR); Taewoo Kim, Suwon-si (KR); Hyeongju Lee, Suwon-si (KR); Bongkyu Min, Suwon-si (KR); Jungsik Park, Suwon-si (KR); Hyelim Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/718,891

(22) Filed: Apr. 12, 2022

(65) Prior Publication Data

US 2022/0240384 A1   Jul. 28, 2022

Related U.S. Application Data

(63) Continuation of application No. 17/132,484, filed on Dec. 23, 2020, now Pat. No. 11,330,716, which is a
(Continued)

(30) Foreign Application Priority Data

May 29, 2018   (KR) .................. 10-2018-0061270

(51) Int. Cl.
*H01Q 1/24*      (2006.01)
*H05K 1/14*      (2006.01)
(Continued)

(52) U.S. Cl.
CPC ............. *H05K 1/144* (2013.01); *H01Q 1/243* (2013.01); *H04M 1/0264* (2013.01);
(Continued)

(58) Field of Classification Search
CPC ...... H05K 1/144; H05K 1/0243; H05K 1/115; H05K 5/0086; H04M 1/0264
(Continued)

(56) References Cited

U.S. PATENT DOCUMENTS 8,766,271 B2   7/2014 Kim et al.
8,783,577 B2   7/2014 Suzuki et al.
(Continued)

FOREIGN PATENT DOCUMENTS

CN   107086384 A   8/2017
EP   2843913 A1    3/2015
(Continued)

OTHER PUBLICATIONS

International Search Report dated Sep. 6, 2019.
(Continued)

*Primary Examiner* — Andargie M Aychillhum
(74) *Attorney, Agent, or Firm* — Jefferson IP Law, LLP

(57) ABSTRACT

According to an embodiment of the disclosure, an electronic device comprises a first printed circuit board including a first electrical terminal exposed on one face of a first area, a second electrical terminal exposed on the one face of a second area and insulated from the first electrical terminal, and a first ground terminal exposed on the one face of a third area formed between the first area and the second area, the third area having a width narrower than a width of the first area or the width of the second area; and a second printed circuit board including a third electrical terminal exposed on one face of a fourth area, a fourth electrical terminal exposed on the one face of a fifth area and electrically connected to the third electrical terminal, and a second ground terminal exposed on the one face of a sixth area located between the fourth area and the fifth area, wherein the second printed circuit board is disposed on the first printed circuit board to
(Continued)

overlap the third area, the first electrical terminal and the third electrical terminal are electrically coupled to each other, the second electrical terminal and the fourth electrical terminal are electrically coupled to each other, and the first ground terminal and the second ground terminal are electrically coupled to each other.

14 Claims, 23 Drawing Sheets

Related U.S. Application Data continuation of application No. 16/413,797, filed on May 16, 2019, now abandoned.

(51) Int. Cl.
| | | |
|---|---|---|
| *H05K 5/00* | (2006.01) | |
| *H05K 1/02* | (2006.01) | |
| *H05K 1/11* | (2006.01) | |
| *H05K 3/46* | (2006.01) | |
| *H04M 1/02* | (2006.01) | |
| *H05K 1/03* | (2006.01) | |
| *H04M 1/03* | (2006.01) | |

(52) U.S. Cl.
CPC .......... *H04M 1/0277* (2013.01); *H05K 1/025* (2013.01); *H05K 1/0243* (2013.01); *H05K 1/0366* (2013.01); *H05K 1/115* (2013.01); *H05K 3/4644* (2013.01); *H05K 5/0086* (2013.01); *H04M 1/03* (2013.01); *H05K 2201/042* (2013.01); *H05K 2201/09027* (2013.01); *H05K 2201/1009* (2013.01); *H05K 2201/10098* (2013.01); *H05K 2201/10121* (2013.01); *H05K 2201/10151* (2013.01); *H05K 2201/10234* (2013.01)

(58) Field of Classification Search
USPC ........................................... 361/803
See application file for complete search history.

(56) References Cited

U.S. PATENT DOCUMENTS

| | | | |
|---|---|---|---|
| 8,828,525 B2 | 9/2014 | Kido et al. | |
| 9,293,426 B2 | 3/2016 | Hossain et al. | |
| 9,692,476 B2 | 6/2017 | Gundel et al. | |
| 10,342,131 B1 | 7/2019 | Kim et al. | |
| 10,498,038 B2 | 12/2019 | Ha et al. | |
| 2008/0169349 A1 | 7/2008 | Suzuki et al. | |
| 2009/0008136 A1 | 1/2009 | Ikeguchi et al. | |
| 2012/0212378 A1 | 8/2012 | Sung et al. | |
| 2012/0252535 A1 | 10/2012 | Kajiwara et al. | |
| 2014/0177180 A1 | 6/2014 | Malek et al. | |
| 2017/0293585 A1 | 10/2017 | Lee et al. | |
| 2018/0017999 A1 | 1/2018 | Kim et al. | |
| 2018/0084637 A1 | 3/2018 | Ueda | |
| 2018/0267390 A1* | 9/2018 | Kim | H04N 23/52 |
| 2019/0067844 A1 | 2/2019 | Go et al. | |
| 2019/0116405 A1* | 4/2019 | Noh | G02F 1/13338 |
| 2020/0185860 A1 | 6/2020 | Zeng et al. | |
| 2020/0267861 A1* | 8/2020 | Kim | H05K 5/0247 |

FOREIGN PATENT DOCUMENTS

| | | |
|---|---|---|
| EP | 3618193 A1 | 3/2020 |
| JP | 2012-109386 A | 6/2012 |
| JP | 2012-109387 A | 6/2012 |
| KR | 10-2007-0110444 A | 11/2007 |
| KR | 10-2008-0017812 A | 2/2008 |
| KR | 10-2012-0063961 A | 6/2012 |
| KR | 10-2013-0049079 A | 5/2013 |
| KR | 10-2013-0105850 A | 9/2013 |
| KR | 10-2017-0062283 A | 6/2017 |
| KR | 10-2017-0089524 A | 8/2017 |
| KR | 10-2018-0008945 A | 1/2018 |
| KR | 10-2019-0125461 A | 11/2019 |

OTHER PUBLICATIONS

Extended European Search Report dated Jun. 23, 2021, issued in European Application No. 19811433.2-1202.
Indian Office Action dated Jun. 16, 2022; Indian Appln. No. 202017056224.
Extended European Search Report dated Oct. 13, 2022; European Appln. No. 22178809.4-1202 / 4081001.
Korean Office Action with English translation dated Apr. 4, 2023; Korean Appln. No. 10-2018-0061270.
Korean Notice of Patent Grant with English translation dated Sep. 8, 2023; Korean Appln. No. 10-2023-0029974.

* cited by examiner

OVERLAPPING PRINTED CIRCUIT BOARDS AND ELECTRONIC DEVICE INCLUDING SAME

CROSS-REFERENCE TO RELATED APPLICATION(S)

This application is a continuation application of prior application Ser. No. 17/132,484, filed on Dec. 23, 2020, which is a continuation application of prior application Ser. No. 16/413,797, filed on May 16, 2019, which is based on and claims priority under 35 U.S.C. § 119(a) of a Korean patent application Serial number 10-2018-0061270, filed on May 29, 2018, in the Korean Intellectual Property Office, the disclosure of which is incorporated by reference herein in its entirety.

BACKGROUND

1. Field

Certain embodiments relate to overlapping printed circuit boards and an electronic device including the printed circuit boards.

2. Description of Related Art

The above information is presented as background information only to assist with an understanding of the disclosure. No determination has been made, and no assertion is made, as to whether any of the above might be applicable as prior art with regard to the disclosure.

With the development of digital technologies, electronic devices are being produced in various forms such as a smart phone, a tablet personal computer (PC), and a personal digital assistant (PDA). Electronic devices are also being developed in a user wearable form in order to improve portability and a user's accessibility. An electronic device may include a printed circuit board connecting electronic components, and the printed circuit board may support data input/output and data exchange between the electronic components.

SUMMARY

A printed circuit board may include, for example, an area having that is relatively thin, which may be more likely than other areas to be damaged (cracked) due to an impact when the printed circuit board is coupled to or separated from an electronic device. The thickness of the area may be increased to make the area more rigid. However, this may consume more of the internal space in the electronic device and make it difficult to install other elements.

Electronic components may transmit or receive data signals through signal lines etched on the printed circuit board. Due to current flow, an electric field is formed in the signal lines, and this electric field causes electromagnetic interference (EMI) that interferes with the normal operation of the electronic components by introducing noise to a nearby electronic component or signals transmitted to another nearby signal line. In order to suppress such electromagnetic interference (e.g., noise), the signal lines may be designed to be located as far as possible from the nearest signal lines and electronic components, or may be designed such that the signal strength is high. However, with portable electronic devices large numbers of electronic components for various functions and signal lines associated therewith are being added to relatively small-volume electronic devices. In this regard, it is becoming more difficult to design the signal lines in a printed circuit board (e.g., the area formed in a relatively narrow width in the printed circuit board).

An embodiment of the disclosure provides overlapping printed circuit boards disposed to reinforce the rigidity of at least a portion of the printed circuit boards and an electronic device including the printed circuit boards.

An embodiment of the disclosure provides overlapping printed circuit boards disposed to secure a wiring area and an electronic device including the printed circuit boards.

According to an embodiment of the disclosure, an electronic device comprises a first printed circuit board including a first electrical terminal exposed on one face of a first area, a second electrical terminal exposed on the one face of a second area and insulated from the first electrical terminal, and a first ground terminal exposed on the one face of a third area formed between the first area and the second area, the third area having a width narrower than a width of the first area or the width of the second area; and a second printed circuit board including a third electrical terminal exposed on one face of a fourth area, a fourth electrical terminal exposed on the one face of a fifth area and electrically connected to the third electrical terminal, and a second ground terminal exposed on the one face of a sixth area located between the fourth area and the fifth area, wherein the second printed circuit board is disposed on the first printed circuit board to overlap the third area, the first electrical terminal and the third electrical terminal are electrically coupled to each other, the second electrical terminal and the fourth electrical terminal are electrically coupled to each other, and the first ground terminal and the second ground terminal are electrically coupled to each other.

According to certain embodiments, it is easy to reinforce at least some areas of the first printed circuit board and to secure a wiring area using one or more second printed circuit boards that overlap and coupled to the first printed circuit board, without increasing the wiring density in the areas or without designing the areas so as to expand the width thereof.

In addition, effects obtainable or predicted by certain embodiments of the disclosure will be directly or implicitly disclosed in the detailed description of the embodiments of the disclosure. For example, various effects that are expected according to certain embodiments of the disclosure will be disclosed within the following detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
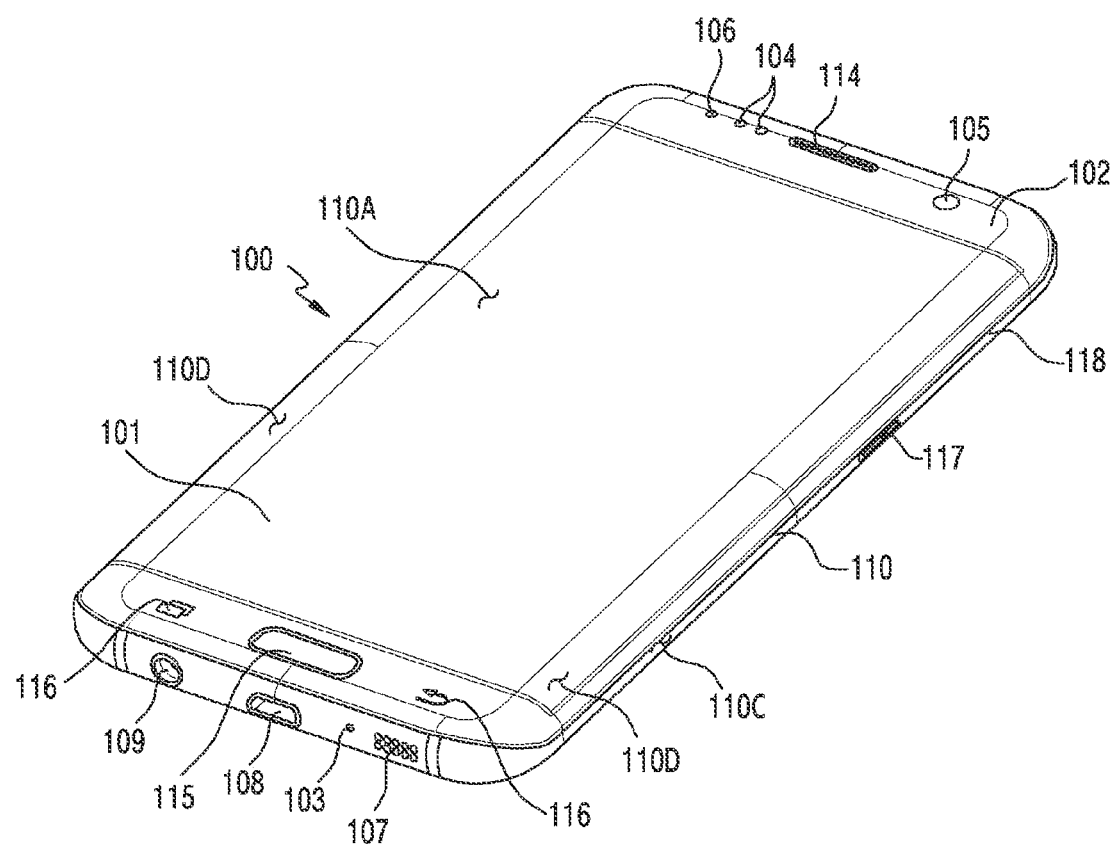
FIG. 1 is a front side perspective view of a mobile electronic device according to an embodiment.

Hereinafter, certain embodiments of the disclosure will be described with reference to the accompanying drawings. The certain embodiments and the terms used herein are not intended to limit the technical features disclosed herein to specific embodiments, and should be understood to include various modifications, equivalents, and/or alternatives to the corresponding embodiments. In describing the drawings, similar reference numerals may be used to designate similar constituent elements. The singular form of a noun corresponding to an item may include one item or a plurality of items unless the relevant context clearly indicates otherwise. In the disclosure, the expression "A or B", "at least one of A and B", "at least one of A or B", "A, B, or C", or "at least one of A, B, or C" may include all possible combinations of items enumerated together. The expression "a first", "a second", "the first", or "the second" may modify corresponding elements regardless of the order or importance, and is used only to distinguish one element from another element, but does not limit the corresponding elements. When an element (e.g., first element) is referred to as being "coupled" or "connected" to another element (second element) with or without the term "functionally" or "communicatively", the element may be connected directly (e.g., wiredly) to the another element or connected to the another element through yet another element (e.g., third element).

The electronic device according to certain embodiments disclosed herein may be various types of devices. The electronic device may, for example, include at least one of a portable communication device (e.g., smartphone) a computer device, a portable multimedia device, a portable medical device, a camera, a wearable device, and a home appliance. The electronic device according to one embodiment of the disclosure is not limited to the above described devices. In the disclosure, the term "user" may indicate a person using an electronic device or a device (e.g., an artificial intelligence electronic device) using an electronic device.

Figure 2:
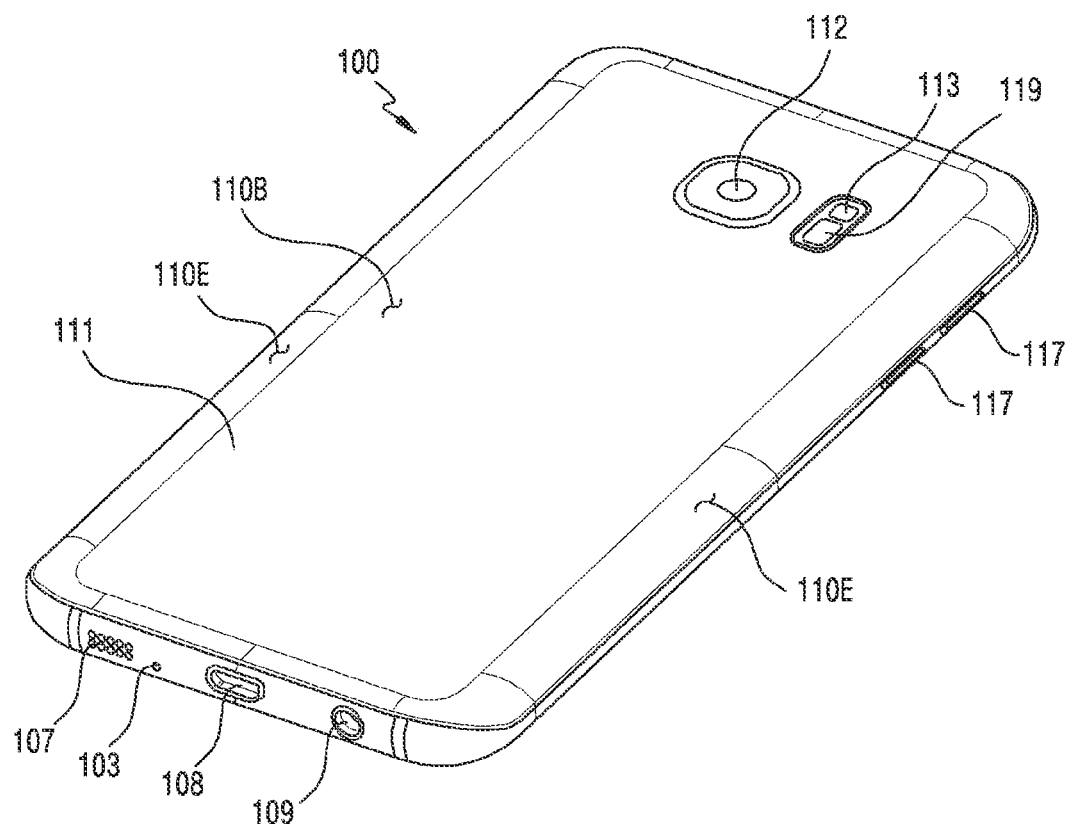
FIG. 2 is a rear side perspective view of the electronic device of FIG. 1.
Figure 3:
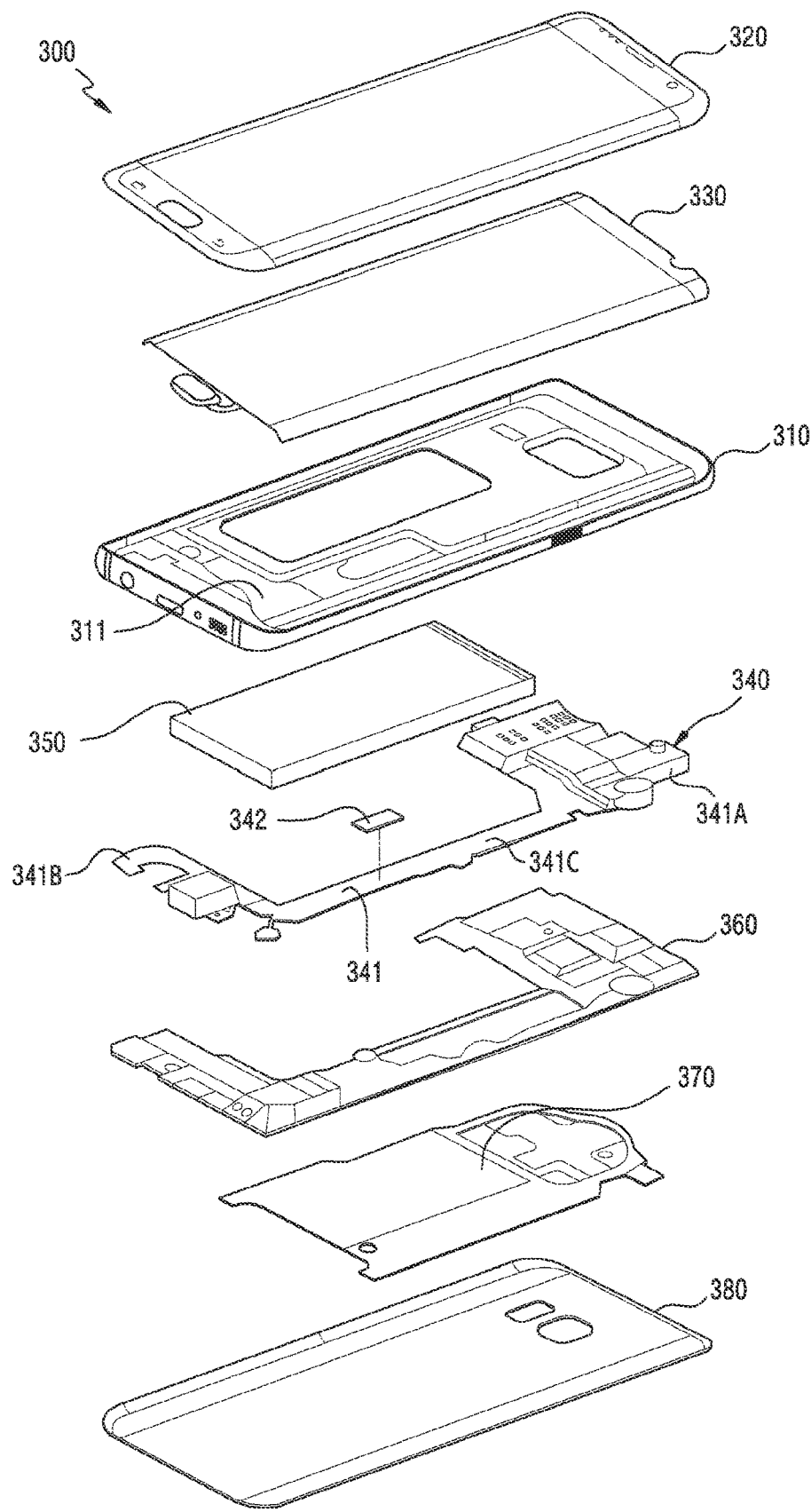
FIG. 3 is an exploded perspective view of the electronic device of FIG. 1.

FIG. 1 is a front side perspective view of a mobile electronic device according to an embodiment. FIG. 2 is a rear side perspective view of the electronic device of FIG. 1. FIG. 3 is an exploded perspective view of the electronic device of FIG. 1.

Referring to FIGS. 1 and 2, an electronic device 100 according to an embodiment may include a housing 110 including a first face (or a front face) 110A, a second face (or a rear face) 110B, and a side face 110C surrounding a space between the first face 110A and the second face 110B. In another embodiment (not illustrated), the term "housing" may refer to a structure forming some of the first face 110A, the second face 110B, and the side face 110C of FIG. 1. According to an embodiment, at least part of the first face 110A may be formed of a substantially transparent front plate 102 (e.g., a glass plate or a polymer plate including various coating layers). The second face 110B may be formed of a substantially opaque rear plate 111. The rear plate 111 may be formed of, for example, coated or colored glass, ceramic, a polymer, or a metal (e.g., aluminum, stainless steel (STS), or magnesium), or a combination of two or more of these materials. The side face 110C may be formed by a side bezel structure (or a "side member") 118 coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include two first areas 110D, which are bent from the first face 110A toward the rear plate 111 and extend seamlessly, at the long opposite side edges thereof. In the illustrated embodiment (see FIG. 2), the rear plate 111 may include two second areas 110E, which are bent from the second face 110B toward the front plate 102 and extend seamlessly, at the long opposite side edges thereof. In some embodiments, the front plate 102 (or the rear plate 111) may include only one of the first areas 110D (or the second areas 110E). In another embodiment, some of the first areas 110D and the second areas 110E may not be included. In the above embodiments, when viewed from a side of the electronic device 100, the side bezel structure 118 may have a first thickness (or width) on the side in which the first areas 110D or the second areas 110E are not included, and may have a second thickness (or width), which is thinner than the first thickness, on the side in which the first areas 110D or the second areas 110E are included.

According to an embodiment, the electronic device 100 may include one or more of a display 101, audio modules 103, 107, and 114, sensor modules 104, and 119, camera modules 105, 112, and 113, key input devices 115, 116, and 117, an indicator 106, and connector holes 108 and 109. In some embodiments, in the electronic device 100, at least one of the components ((e.g., the key input devices 115, 116, and 117 or the indicator 116) may be omitted, or other components may be additionally included.

The display 101 may be exposed through, for example, a large portion of the front plate 102. In some embodiments, at least a part of the display 101 may be exposed through the front plate 102 forming the first face 110A and the first areas 110D of the side faces 110C. The display 101 may be coupled to or disposed adjacent to a touch-sensing circuit, a pressure sensor capable of measuring touch intensity (pressure), and/or a digitizer that detects a magnetic-field-type stylus pen. In some embodiments, at least some of the sensor modules 104 and 119 and/or at least some of the key input devices 115, 116, and 117 may be disposed in the first areas 110D and/or the second areas 110E.

According to an embodiment, the audio modules 103, 107, and 114 may include a microphone hole 103 and speaker holes 107 and 114. The microphone hole 103 may include a microphone disposed therein so as to acquire external sound, and in some embodiments, the microphone hole 125 may include multiple microphones disposed therein so as to sense the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker (e.g., a piezo speaker) may be included without the speaker holes 107 and 114.

According to an embodiment, the sensor modules 104 and 119 may generate an electrical signal or a data value corresponding to the internal operating state of the electronic device 100 or an external environmental condition. The sensor modules 104 and 119 may include, for example, a first sensor module 104 (e.g., a proximity sensor) and/or a second sensor module (not illustrated) (e.g., a fingerprint sensor) disposed on the first face 110A of the housing 110, and/or a third sensor module 119 (e.g., an HRM sensor) disposed on the second face 110B of the housing 110. The fingerprint sensor may be disposed not only on the first face 110A of the housing 110 (e.g., the home button 115), but also on the second face 110B thereof. The electronic device 100 may further include at least one of sensors (not illustrated) such as a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, and an illuminance sensor.

According to an embodiment, the camera modules 105, 112, and 113 may include a first camera device 105 disposed on the first face 110A of the electronic device 100 and a second camera device 112 and/or a flash 113 disposed on the second face 110B. The camera devices 105 and 112 may include one or more lenses, an image sensor, and/or an image signal processor. The flash 113 may include, for example, a light-emitting diode or a xenon lamp. In some embodiments, two or more lenses (e.g., an infrared camera lens, a wide-angle lens, and a telephoto lens) and image sensors may be disposed on one face of the electronic device 100.

According to an embodiment, the key input devices 115, 116, and 117 may include a home key button 115 disposed on the first face 110A of the housing 110, a touch pad 116 disposed in the vicinity of the home key button 115, and/or a side key button 117 disposed on the side face 110c of the housing 110. In another embodiment, the electronic device 100 may not include some or all of the above-mentioned key input devices 115, 116, and 117, and a key input device 115, 116, or 117, which is not included, may be implemented in another form such as a soft key on the display 101.

The indicator 106 may be disposed on, for example, the first face 110A of the housing 110. The indicator 106 may include an LED as long as it can provide, for example, the state information of the electronic device 100 in an optical form.

According to an embodiment, the connector holes 108 and 109 may include a first connector hole 108 capable of accommodating a connector (e.g., a USB connector) for transmitting and receiving power and/or data to and from an external electronic device, and/or a second connector hole 109 capable of accommodating a connector (e.g., an earphone jack) for transmitting and receiving an audio signal to and from an electronic device.

Referring to FIG. 3, the electronic device 300 may include a side bezel structure 310, a first support member 311 (e.g., a bracket), a front plate 320, a display 330, a printed circuit board(s) (PCB(s)) 340, a battery 350, a second support member 360 (e.g., a rear case), an antenna 370, and a rear plate 380. In some embodiments, in the electronic device 300, at least one of the components (e.g., the first support member 311 or the second support member 360) may be omitted, or other components may be additionally included. At least one of the components of the electronic device 300 may be the same as or similar to at least one of the components of the electronic device 100 of FIG. 1 or 2, and a redundant description is omitted below.

According to an embodiment, the first support member 311 may be disposed inside the electronic device 300 and may be connected to the side bezel structure 310, or may be formed integrally with the side bezel structure 310. The first support member 311 may be formed of, for example, a metal material and/or a non-metal (e.g., polymer) material. The display 330 may be coupled to one side of the first support member 311, and the printed circuit board(s) 340 may be coupled to the other side of the first support member 311. On the printed circuit board(s) 340, a processor, a memory, and/or an interface may be mounted. The processor may include one or more of, for example, a central processing unit, an application processor, a graphic processor, an image signal processor, a sensor hub processor, or a communication processor.

The memory may include, for example, volatile memory or nonvolatile memory.

The interface may include, for example, a high definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/an MMC connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed to be substantially flush with, for example, the printed circuit board(s) 340. The battery 350 may be integrally disposed within the electronic device 300, or may be mounted so as to be detachable from the electronic device 300.

The second support member 360 may be coupled to, for example, the first support member 311, and may be disposed between the printed circuit board(s) 340 and the first rear plate 380. The second support member 360 may be coupled to the first support member 311 together with the printed circuit board(s) 340 using bolt fastening or the like, and may serve to cover and protect the printed circuit board(s) 340.

According to an embodiment, the antenna 370 may be disposed between the rear plate 380 and the display 350. The antenna 370 may include, for example, a near-field communication (NFC) antenna, a wireless charging antenna, and/or a magnetic secure transmission (MST) antenna. The antenna 370 is capable of, for example, performing short-range communication with an external device or transmitting and receiving power required for charging in a wireless manner. In another embodiment, an antenna structure may be formed by the side bezel structure 310, a portion of the first support member 311, or a combination thereof.

According to an embodiment, the printed circuit board(s) 340 may include a first printed circuit board 341 and at least one second printed circuit board 342 disposed to overlap the first printed circuit board 341.

According to an embodiment, the first printed circuit board 341 or the second printed circuit board 342 may be a multilayer printed circuit board. The multilayer printed circuit board may be formed by forming a plurality of inner layers in which a circuit is formed using a copper-clad laminate (CCL) (or an original plate) and laminating the plurality of inner layers. According to some embodiments, the first printed circuit board 341 or the second printed circuit board 342 formed on the basis of the copper-clad laminate may be a single-side printed circuit board in which a circuit is formed on only one side and a double-sided printed circuit board in which circuits are formed on both sides.

The second printed circuit board 342 may reinforce, for example, the first printed circuit board 341. According to an embodiment, the first printed circuit board 341 may include a first area 341A, a second area 341B, and a third area 341C disposed between the first area 341A and the second area 341B. The third area 341C may be disposed along the side of the battery. As a result, the third area 341C may have a narrower width than the first area 341A or the second area 341B, and may be more likely than the first area 341A of the second 341B area to be damaged due to cracks or the like (it is noted that the third area 341C may have a narrow width for other reasons). The second printed circuit board 342 may be disposed to overlap the third area 341C so as to be used as a reinforcing member (e.g., a reinforcing plate) to reinforce the rigidity of the third area 341C. According to certain embodiments, the second printed circuit board 342 may be coupled to overlap various other areas of the first printed circuit board 341 that require reinforcement.

The second printed circuit board 342 may provide an electric path connected to, for example, the first printed circuit board 341. For example, the first printed circuit board 341 may include a first area 341A, a second area 341B, and a third area 341C disposed between the first area 341A and the second area 341B, and may include a first electrical terminal exposed on one face of the first area 341A, and a second electrical terminal exposed on one face of the second area 341B and physically separated from the first electrical terminal. The second printed circuit board 342 may include a third electrical terminal exposed on one face of a fourth area and a fourth electrical terminal exposed on one face of a fifth area, and the third electrical terminal and the fourth electrical terminal are electrically connected to each other. When the first printed circuit board 341 and the second printed circuit board 342 are coupled to each other, the first electrical terminal is coupled to the third electrical terminal via solder, and the second electrical terminal is coupled to the fourth electrical terminal via solder. Thereby, the first electrical terminal and the second electrical terminal may be electrically connected to each other through the second printed circuit board 342. The electrical terminals may include signal terminals, conductive terminals, contact terminals, or conductive pads.

For example, the first printed circuit board 341 may include a first ground terminal exposed at least in some areas (e.g., the third area disposed between the first area 341A and the second area 341B). The first ground terminal may be a part of a first ground included in the first printed circuit board 341 or may be electrically connected to the first ground. The second printed circuit board 342 may include a second ground terminal exposed on one face thereof, and the second ground terminal may be a part of the second ground (or a second ground circuit) included in the second printed circuit board 342, or may be electrically connected to the second ground. When the second printed circuit board 342 is coupled to the first printed circuit board 341, solder interconnecting the first ground terminal and the second ground terminal is disposed, by which the first ground and the second ground can be electrically connected to each other. The first ground and the second ground may be utilized as the ground of the corresponding potential, so that the noise or electromagnetic interference (EMI) generated in the electronic device 300 can be reduced.

According to certain embodiments, the second printed circuit board 342 may include a third ground that is physically separated from the first ground of the first printed circuit board 341. The first ground may have a first potential, and the third ground may have a second potential different from the first potential. The noise generated in the electronic device 300 may be attenuated by being dispersed to the first ground and the third ground. For example, a relatively high noise floor (e.g., a measured value for the sum of noise) of the noise generated by the electronic device 300 may be attenuated either by the first ground or by the third ground.

According to certain embodiments, the second printed circuit board 342 may be utilized as a part (e.g., an antenna) of a transmission circuit for wireless communication. At least a part of the circuit formed on the second printed circuit board 342 is electrically connected to a communication circuit mounted on the first printed circuit board 341, and the communication circuit may support various types of communication using the second printed circuit board 343. For example, the communication circuit may be electrically connected to the circuit and to a processor (not shown) included in the second printed circuit board 342. The communication circuit may include radio frequency (RF) components such as a radio frequency integrated circuit (RFIC) and a front-end module (FEM) between the second printed circuit board 342 and the processor. For example, the RFIC may receive external radio waves through the second printed circuit board 342, and may modulate the received high-frequency waves to a low frequency band (e.g., a baseband) that can be processed by the processor. The RFIC is capable of modulating low-frequency waves to high-frequency waves for transmission in the processor. The FEM may connect the second printed circuit board 342 and the RFIC, and may separate transmitted and received signals. For example, the FEM may perform filtering and amplification, and may include a reception-end FEM in which a filter is embedded in order to filter a received signal and a transmission-end FEM in which a power amplifier module (PAM) is embedded in order to amplify a transmitted signal.

According to certain embodiments, the second printed circuit board 342 may be used for at least one communication system among single input multiple output (SIMO), multiple input single output (MISO), diversity, and multiple input multiple output (MIMO).

According to some embodiments, the second printed circuit board 342 may be utilized as an antenna-matching circuit. The radiation characteristics and impedance of an antenna (e.g., the antenna 370 in FIG. 3) are related to antenna performance, and may vary depending on the shape, size, and material of the antenna. The radiation characteristics of the antenna may include an antenna radiation pattern (or an antenna pattern), which is a directional function indicating the relative distribution of power radiated from the antenna, and the polarization state of electromagnetic waves radiated from the antenna (e.g., antenna polarization). The impedance of the antenna may be related to the transmission of power from a transmitter to the antenna or from the antenna to a receiver. In order to minimize reflection at a transmission line and an antenna connection portion, the impedance of the antenna is designed to match the impedance of the transmission line, thereby enabling maximum power transmission (or minimization of power loss) or efficient signal transmission through the antenna. The impedance matching may induce efficient signal flow at a specific frequency (or a resonant frequency). Impedance mismatch may cause power loss or reduce the strength of transmitted/received signals, thereby degrading communication performance. According to an embodiment, the circuit included in the second printed circuit board 342 may be utilized as a frequency adjustment circuit in order to eliminate such impedance mismatch.

According to an embodiment, the frequency adjustment circuit may include a switching circuit that switches to at least one designated matching circuit (e.g., a circuit included in the second printed circuit board 342) or a circuit that adjusts impedance using the second printed circuit board 342. For example, the frequency adjustment circuit may shift the resonant frequency to a designated frequency using the second printed circuit board 342, or may shift the resonant frequency as specified.

FIG. 4A-5F are views related to a manufacturing flow of a second printed circuit board, such as second printed circuit board 342 in FIG. 3.

Figure 4A:
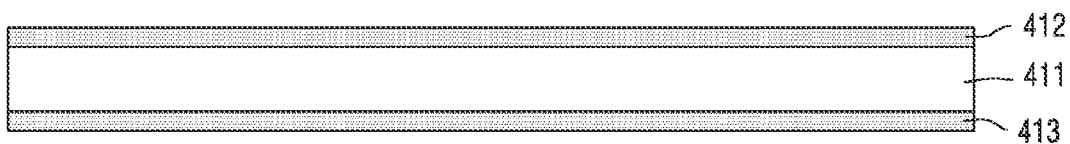
FIG. 4A is a view related to a manufacturing flow of a second printed circuit board in FIG. 3.

Referring to FIG. 4A, in an embodiment, a copper-clad laminate (or an original plate) 410 may be formed. The copper-clad laminate 410 is a laminate for use in a printed circuit, and may include a structure in which copper foils 412 and 413 are attached to both sides of an insulating layer (or an insulating plate) 411 composed of various basic insulating materials (e.g., a resin) and a binder.

The copper foils 412 and 413 may be, for example, electrolytic copper foils formed through a chemical-electrolytic reaction. According to an embodiment, in order to increase the adhesion with the resin of the insulating layer 411, the copper foils 412 and 413 may be made to chemically react with the resin to partially (about 5 μm (micrometers)) penetrate into the resin when forming the copper foils 412 and 413. The thickness of an electrolytic copper foil may be about 18 to 70 μm, but the copper foils 412 and 413 may be variously formed to have thicknesses of 5 μm, 7 μm, and 15 μm, which are thinner than the above-mentioned range, depending on wiring density or fineness. According to some embodiments, the copper foils 412 and 413 may be rolled copper foils that have been rolled and thinned. The thickness of the copper foils 412 and 413 may be variously determined depending on the current allowed in the pattern.

The insulating layer 411 of the copper-clad laminate 410 may include a resin such as phenol or epoxy. The copper-clad laminate 410 may further include a reinforcing base material (not illustrated) such as paper, glass fiber, or glass non-woven fabric. The reinforcing base material is able to increase rigidity of the insulating layer 411 (e.g., longitudinal and transversal rigidity), which may be insufficient when using only a resin, or to reduce the dimensional change rate of the insulating layer with respect to temperature.

The copper-clad laminate 410 may be, for example, a glass-epoxy copper-clad laminate including a base material in which a glass fiber is impregnated (or infiltrated) with an epoxy resin and copper foils 412 and 413 bonded thereto. According to an embodiment, the National Electrical Manufacturers Association (NEMA) classifies copper-clad laminates into classes of, for example, FR (flame retardant)-1, FR-2, FR-3, FR-5, and FR-6, on the basis of base materials and flame resistance (flame retardancy), and the glass-epoxy copper-clad laminate may be one of FR-4 and FR-5. According to an embodiment, FR-4 or FR-5 may include a base material in which woven glass fiber impregnated with an epoxy resin are stacked in several layers and copper foils bonded thereto.

The copper-clad laminate 410 may be a paper-phenol copper-clad laminate including, for example, a base material in which paper is impregnated with phenol resin and copper foils 412 and 413 bonded thereto. According to an embodiment, the paper-phenol copper-clad laminate may be one of FR-1, FR-2 and FR-3 as classified by the NEMA.

The copper-clad laminate 410 may be, for example, a composite copper-clad laminate formed by combining two or more reinforcing base materials. According to an embodiment, the composite copper-clad laminate may include CEM (composite type of laminate material bonded with a flame-retardant epoxy resin)-1, CEM-3, or the like as defined by the NEMA. CEM-1 may include a center base material (or a core) made of paper impregnated with an epoxy resin, outer base materials made of woven glass fiber impregnated with an epoxy resin, and copper foils bonded to the outer base materials. CEM-3 may include a core base material made of non-woven glass fiber (e.g., glass non-woven fabric) impregnated with an epoxy resin, outer base materials made of woven glass fiber impregnated with an epoxy resin, and copper foils bonded to the outer base materials. Glass fiber or paper is capable of improving mechanical workability, heat resistance, or dimensional stability. According to some embodiments, the copper-clad laminate may be FR-6, which includes a central base material made of non-woven glass fiber (e.g., glass non-woven fabric) impregnated with a polyester resin, outer base materials made of glass fiber impregnated with a resin, and copper foils bonded to the outer base materials.

According to certain embodiments, CEM-3 may be designed to replace FR-4 or FR-5. CEM-3 has relatively less glass fiber than FR-4 or FR-5, and thus the mechanical strength of CEM-3 may be relatively low. When CEM-3 is designed to replace FR-4 or FR-5, the mechanical strength may be considered. According to certain embodiments, when punching is required, CEM-3, which is more advantageous for punching, may be applied to the manufacture of printed circuit boards in place of FR-4.

According to certain embodiments, the copper-clad laminate 410 may be a high-frequency copper-clad laminate made of a material capable of withstanding high-speed signal transmission. For example, in a printed circuit board, a signal propagation speed is inversely proportional to the permittivity of a material, and thus it is possible to increase the signal propagation speed when a material with low permittivity is used.

According to some embodiments, the copper-clad laminate 410 may be in the form in which a film prepreg made of an insulating material is disposed on a plate formed of a metal such as aluminum or iron and then a copper foil is bonded to the film prepreg.

According to some embodiments, the copper-clad laminate 410 may include a flexible copper-clad laminate for use in a flexible printed circuit board (FPCB), or the like. The flexible copper-clad laminate may be, for example, in the form in which a flexible polyester film or polyimide film and a copper foil are bonded to each other with an adhesive.

According to certain embodiments, the copper clad laminate 410 may be formed in a structure including an insulating layer 411 of various other materials or structures.

The second printed circuit board (e.g., the second printed circuit board 342 in FIG. 3) may be formed by forming a plurality of plates (hereinafter referred to as "inner layers" or "inner layer substrates") each formed by processing the copper-clad laminate 410, and stacking the plurality of inner layers. The second printed circuit board 342 may be formed through a series of flows including, for example, inner layer circuit printing, inner layer etching, resist peeling, lay-up, stacking, hole-processing, plating, outer layer circuit printing, resist peeling, solder mask printing, and contouring.

Figure 4B:
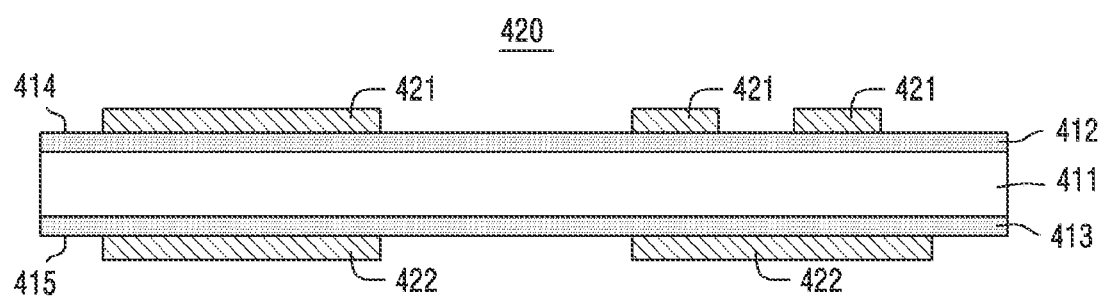
FIG. 4B is a view related to a manufacturing flow of a second printed circuit board in FIG. 3.

Referring to FIGS. 4A and 4B, a structure 420 in which circuit patterns 421 and 422 are printed on the surfaces 414 and 415 of the inner layer copper-clad laminate 410 is formed by the inner layer circuit printing according to an embodiment. According to an embodiment, through a method including applying a photosensitive dry film to the surfaces 414 and 415 of the inner laminate copper-clad laminate 410 with heat and pressure, then irradiating the dry film with light using a master film having a pattern thereon, and then developing the dry film (e.g., a photographic printing method), the circuit patterns (e.g., the portions remaining on the dry film) 421 and 422 may be printed on the surfaces 414 and 415. According to another embodiment, a circuit pattern corresponding to a circuit may be printed on the surfaces 414 and 415 through a method using a silkscreen having a circuit pattern thereon in place of the dry film (e.g., a screen-printing method).

Figure 4C:
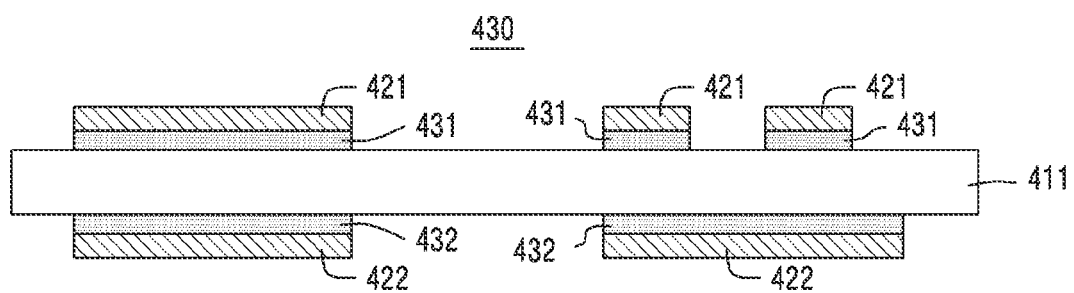
FIG. 4C is a view related to a manufacturing flow of a second printed circuit board in FIG. 3.
Figure 4D:
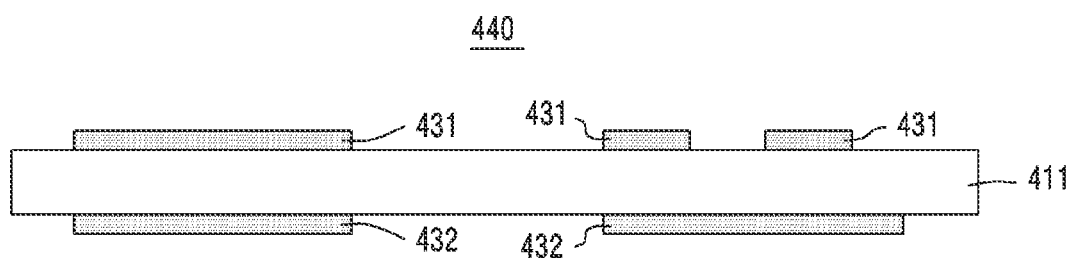
FIG. 4D is a view related to a manufacturing flow of a second printed circuit board in FIG. 3.

Referring to FIGS. 4B and 4C, through the inner layer etching according to an embodiment, only the portions 431 and 432 corresponding to the printed circuit patterns 421 and 422 of the copper foils 412 and 413 are left, and a remaining portion is removed using a corrosive substance, so that a structure 430 may be formed. The portions 431 and 432 remaining without being corroded by being covered by the circuit patterns 421 and 422 may be defined as circuits. Referring to FIGS. 4C and 4D, through the resist peeling according to an embodiment, the circuit patterns (or the etching resists) 421 and 422 are separated, so that an inner layer 440 in which circuits 431 and 432 are coupled to the insulating layer 411 may be formed. The inner layer 440 may include a first circuit 431 and a second circuit 432 respectively disposed on the opposite sides of the insulating layer 411. The first circuit 431 or the second circuit 432 is shown as a plurality of sectional areas when viewed in cross section, but may be formed as an integral conductive pattern. According to some embodiments, the first circuit 431 or the second circuit 432 may include a plurality of physically separated patterns.

According to some embodiments, an inner layer including a circuit may be formed by processing a copper-clad laminate having a structure in which a copper foil is attached to one side of an insulating layer. The inner layer formed by processing the copper-clad laminate may have a structure in which a circuit is disposed on one side thereof.

Figure 5A:
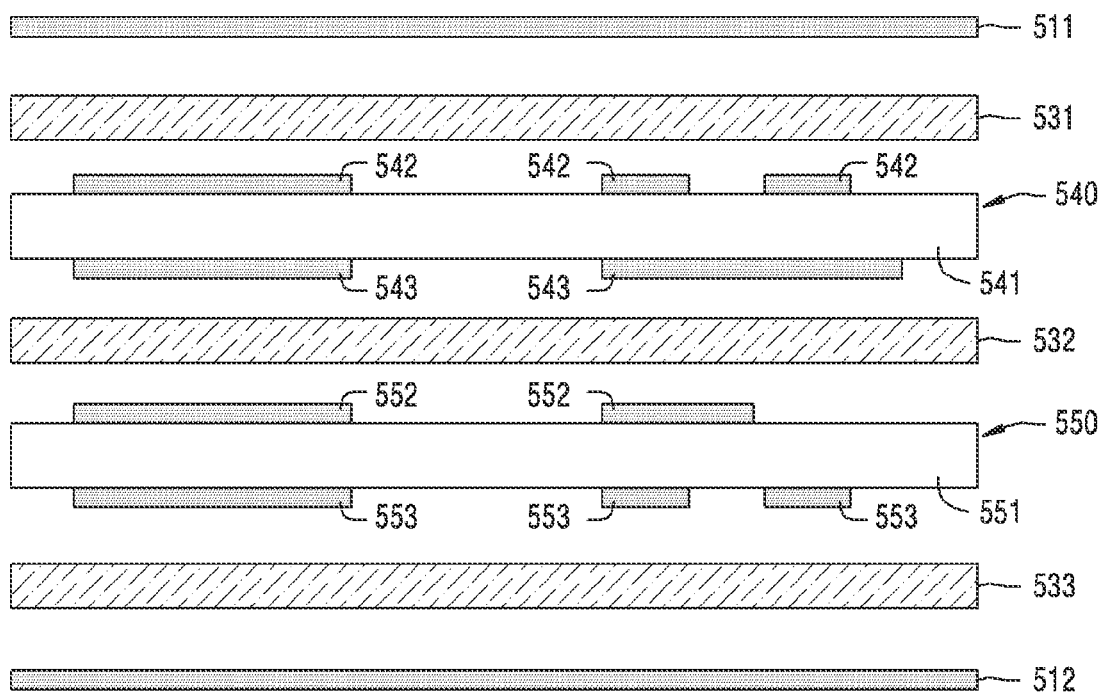
FIG. 5A is a view related to a manufacturing flow of a second printed circuit board in FIG. 3.
Figure 5B:
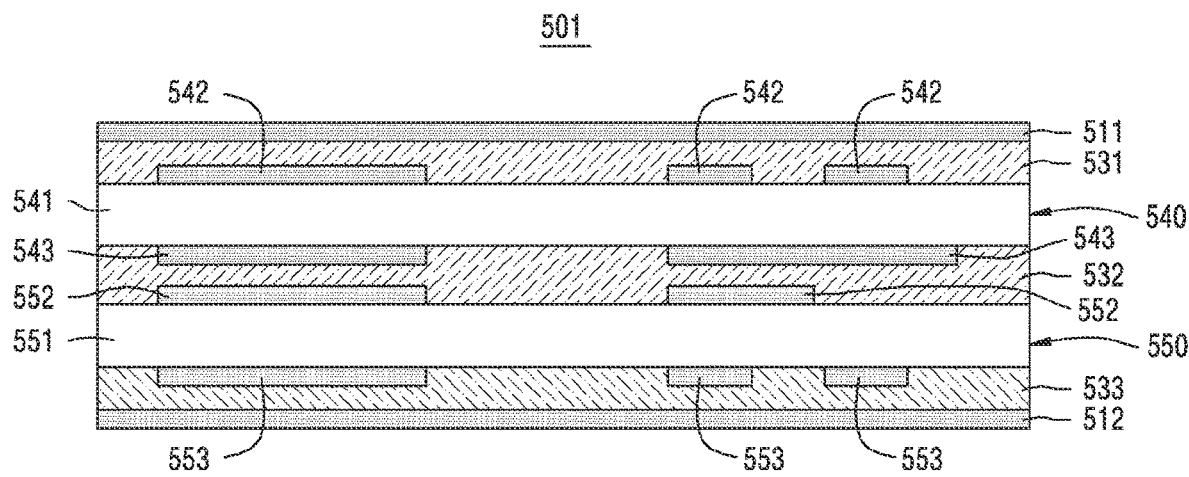
FIG. 5B is a view related to a manufacturing flow of a second printed circuit board in FIG. 3.

Referring to FIGS. 5A and 5B, inner layers 540 and 550 having circuits formed through the lay-up according to an embodiment may be disposed between a first outer layer 511 and a second outer layer 512, which are formed of a copper foil according to a designed stacking structure of respective layers in that order. Each inner layer 540 or 550 has a structure in which the circuits 542 and 543 or 552 and 553 are bonded to an insulating layer 541 or 551, and may be formed by processing a copper-clad laminate according to the manufacturing flow described above with reference to FIGS. 4A, 4B, 4C, and 4D. When the layers 511, 512, 540, 550, 531, 532, and 533 are laid up, the circuits (or wires) 542, 543, 552, and 553 located on the inner layers 540 and 550 may be aligned at designed positions. Through the stacking according to an embodiment, when prepregs 531, 532, and 533 having the functions of adhesion and insulation are disposed between the layers (e.g., the first outer layer 511, the second outer layer 512, and the inner layers 540 and 550) and then high heat and pressure are applied, it is possible to form a first structure 501 in which the layers 511, 512, 540, 550, 531, 532, and 533 are bonded to each other. The prepregs 531, 532, and 533 may be a thermosetting resin including an epoxy resin or glass impregnated with an epoxy resin. According to certain embodiments, the first structure 501 may be formed to include three or more inner layers without being limited to the illustrated example.

According to an embodiment, one inner layer (hereinafter, referred to as a "first inner layer") 540 includes a first circuit 542 and a second circuit 543 respectively disposed on the opposite sides of the insulating layer 541, and another inner layer (hereinafter, referred to as a "second inner layer") 550 may include a third circuit 552 and a fourth circuit 553 respectively disposed on the opposite sides of the insulating layer 551. According to some embodiments, at least one of the first and second inner layers 540 and 550 may have a structure in which a circuit is disposed on one side of the insulating layer.

Figure 5C:
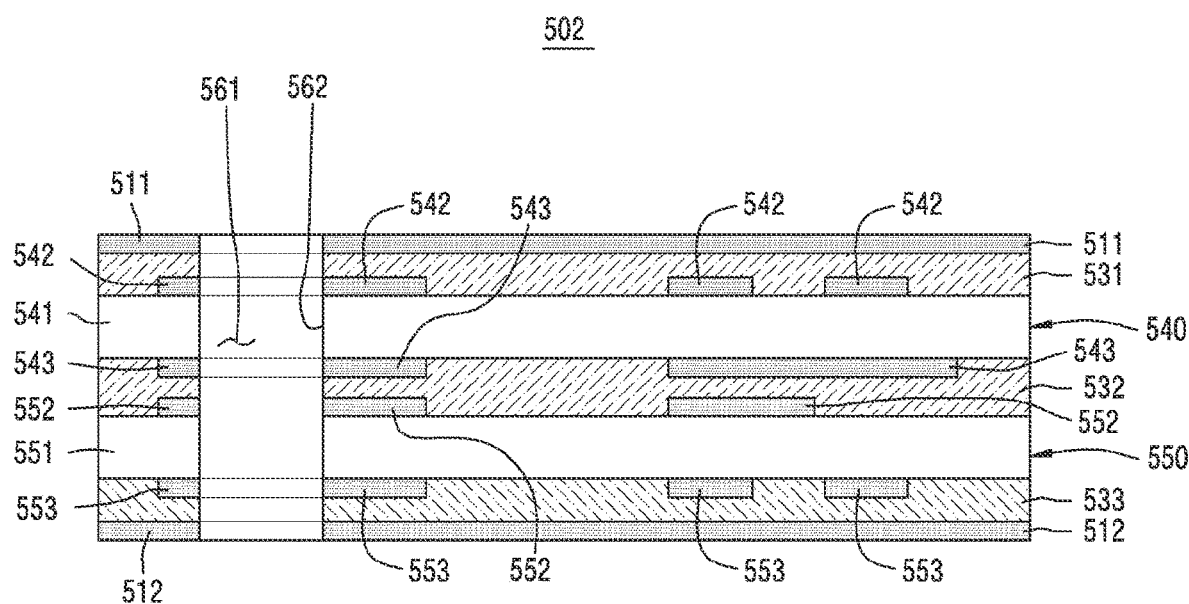
FIG. 5C is a view related to a manufacturing flow of a second printed circuit board in FIG. 3.

Referring to FIGS. 5B and 5C, in an embodiment, by performing hole-processing (e.g., drilling) in a first structure 501, a second structure 502 including a through-hole (or a via) 561 may be formed. The through hole may be defined as a hole perforated in a substrate (e.g., the first structure 501) including outer layers (e.g., the outer layers 511 and 512), prepregs (e.g., the prepregs 531, 532, and 533), and inner layers (e.g., the inner layers 540 and 550) for the purpose of disposing a connection lead in order to electrically connect conductor layers disposed in different layers. Depending on the position at which the through hole is formed, or on the stacking structure corresponding to the position, the conductor layers penetrated by the through hole (e.g., the first outer layer 511 and the second outer layer 512 and one or more circuits included in the inner layers disposed therebetween) may vary. For example, as illustrated in the drawings, a through hole 561 may be formed to penetrate the first outer layer 511, the first circuit 542 and the second circuit 543 of the first inner layer 540, the third circuit 552 and the fourth layer 553 of the second inner layer 550, and the second outer layer 512.

Figure 5D:
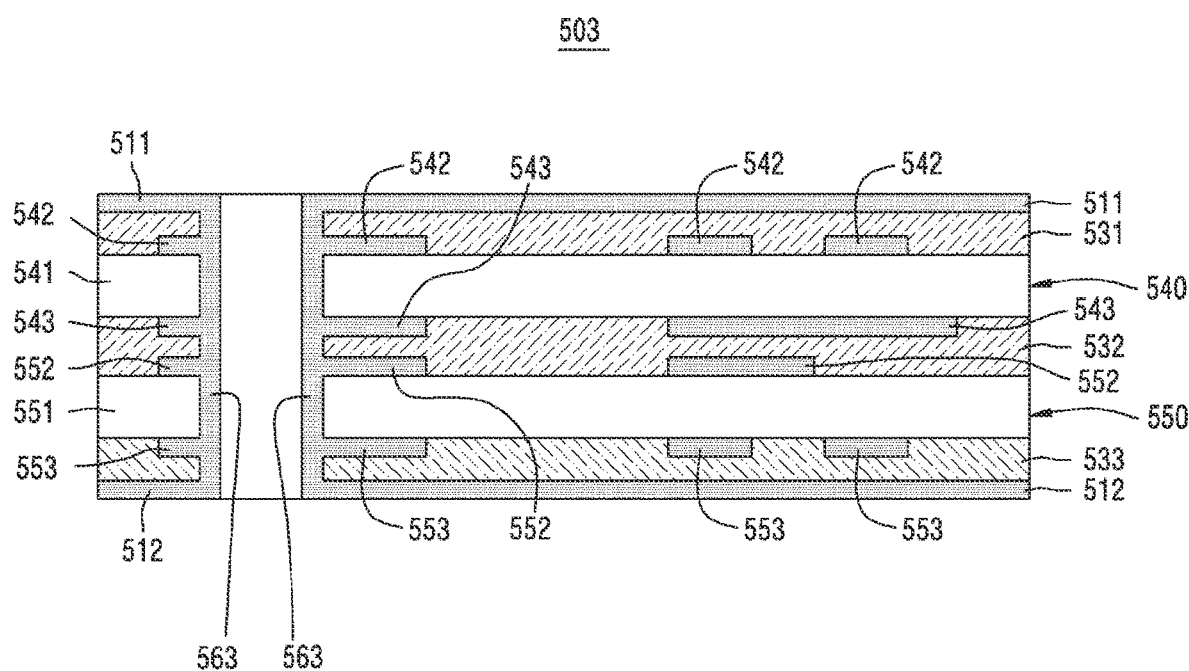
FIG. 5D is a view related to a manufacturing flow of a second printed circuit board in FIG. 3.

Referring to FIGS. 5C and 5D, in an embodiment, the second structure 502 is plated to form a third structure 503 in which the through hole 561 is coated with a conductive material 563 such as copper. Since the face 562 of the through hole 561 does not have an electrical property, electroless copper plating that does not require electricity is primarily performed using a chemical agent first, and then copper may be secondary plated thereon through electroplating. The plated conductive material 563 electrically interconnects conductive portions which are separated from each other as layers (e.g., the first outer layer 511, the second outer layer 512, and the circuits of the inner layers 540 and 550). Depending on the position at which the through hole is formed or the stacking structure corresponding to the position, the face of the through hole may include the inner walls formed in various layers. For example, as illustrated in the drawings, the face 562 of the through hole 561 has inner walls formed in the outer layers 511 and 512, inner walls formed in the prepregs 531, 532, and 533, inner walls formed by the insulating layers 541 and 551, an inner wall formed in the first circuit 542, an inner wall formed in the second circuit 543, an inner wall formed in the third circuit 552, and an inner wall formed in the fourth circuit 543. These inner walls are coated with the conductive material 563, and the outer layers 511 and 512, the first circuit 542, the second circuit 543, the third circuit 552, and the fourth circuit 553 may be electrically connected by the conductive material 563. According to some embodiments, a hole partially pitted from the first outer layer 511 toward the second outer layer 512 or a hole partially pitted from the second outer layer 512 toward the first outer layer 511 is formed, and a conductive material may be plated over the face of the hole.

Figure 5E:
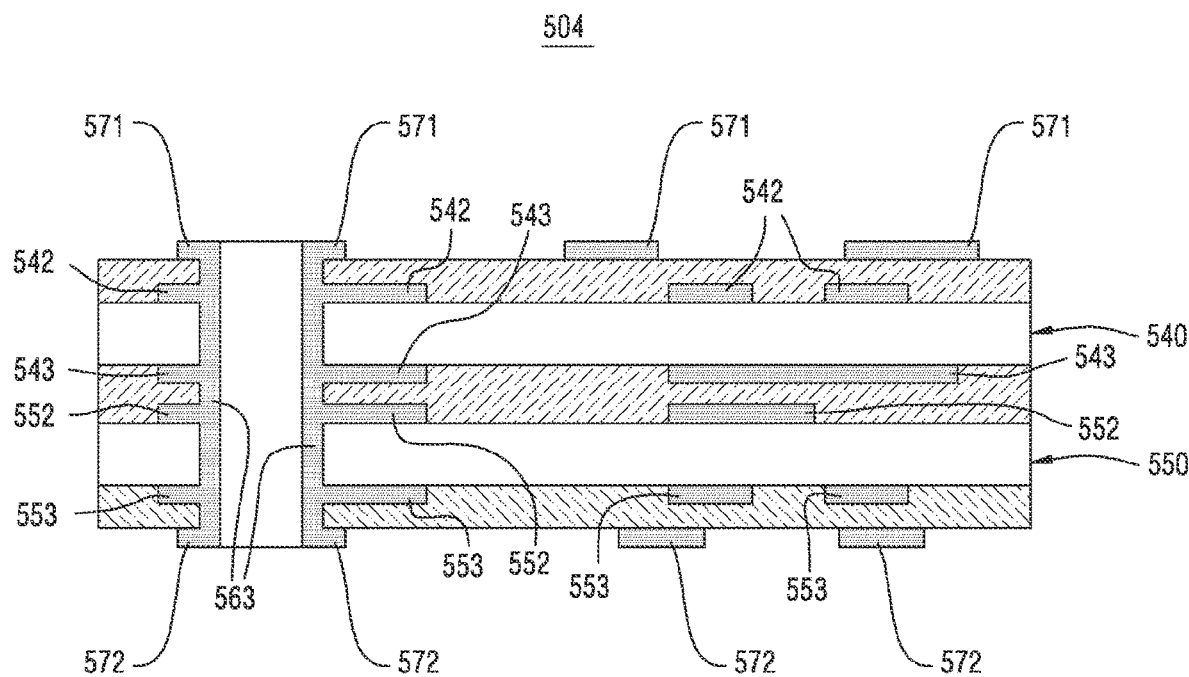
FIG. 5E is a view related to a manufacturing flow of a second printed circuit board in FIG. 3.

Referring to FIGS. 5D and 5E, in an embodiment, outer layer circuit printing for printing a circuit pattern on the surfaces of the first outer layer 511 and the second outer layer 512 of the third structure 503 may be performed by applying the same method as the inner layer circuit printing, and outer layer etching and resist peeling for removing a part of the first outer layer 511 and a part of the second outer layer 512 may be performed by applying the same methods as those used for the inner layer etching and the resist peeling. In the fourth structure 504 formed in this manner, portions remaining after partially removing the first outer layer 511 form a first outer layer circuit 571, and portions remaining after partially removing the second outer layer 512 form a second outer layer circuit 572. Depending on the position at which the through hole is formed, or the stacking structure corresponding to the position, the conductive layers in which the first outer layer 571 and the second outer layer 572 are electrically connected via the conductive material 563 (e.g., the first outer layer 511, the second outer layer 512 and one or more circuits included in the inner layers disposed therebetween) may vary. For example, as illustrated in the drawings, the first outer layer circuit 571 and the second outer layer circuit 572 may be electrically connected to the first circuit 542 and the second circuit 543 of the first inner layer 540 and the third circuit 552 and the fourth circuit 543 of the second inner layer 550 via the conductive material 563.

Figure 5F:
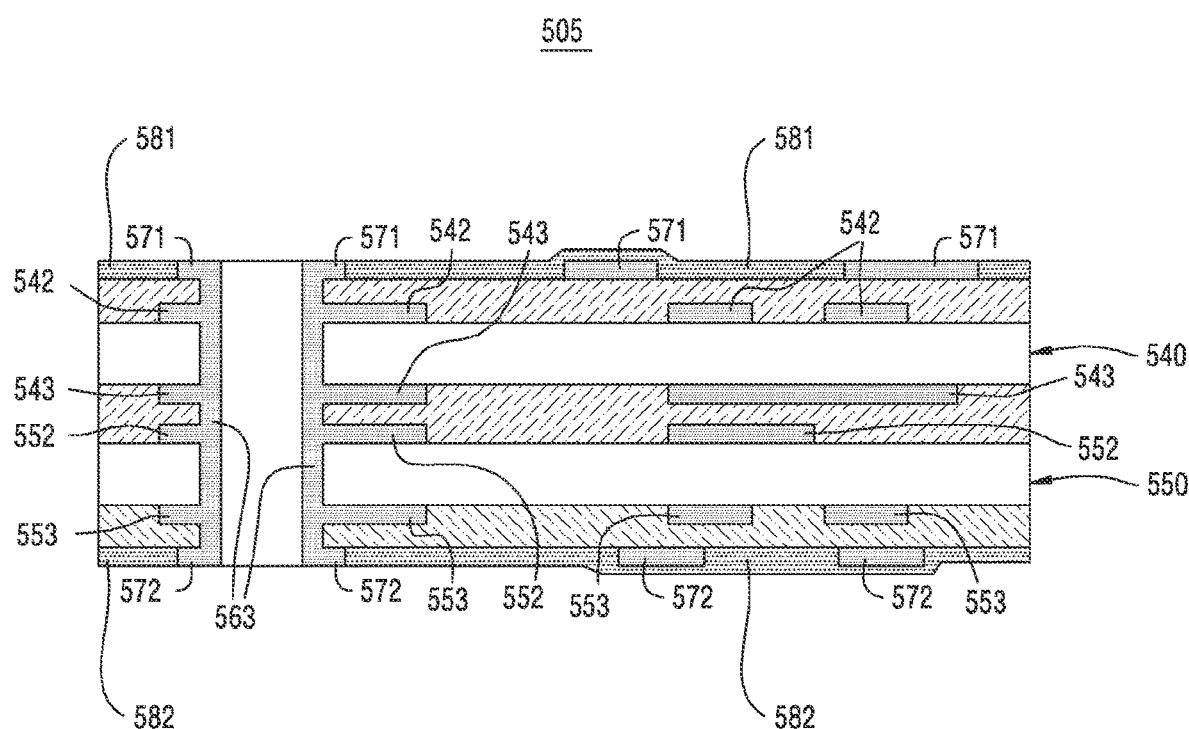
FIG. 5F is a view related to a manufacturing flow of a second printed circuit board in FIG. 3.

Referring to FIGS. 5E and 5F, in an embodiment, by performing solder mask printing on the fourth structure 504, a fifth structure 505 may be formed in which at least a part of the first outer layer circuit 571 or at least a part of the second outer layer circuit 572 is coated with insulating materials 581 and 582 such as solder mask insulating ink of epoxy component. The portions covered by the insulating materials 581 and 582 in the outer layer circuits 571 and 572 are not exposed to the outside, and thus oxidation thereof can be prevented. The insulating materials 581 and 582 may also serve to prevent solder bridges from being generated during component mounting. According to an embodiment, in solder mask printing, photosensitive ink (e.g., photo S/R) may be applied to the entire corresponding face through a silkscreen-printing method or a spray-coating method, unnecessary portions may be removed through exposure and development, and then a remaining portion may be cured. According to some embodiments, in the solder mask printing, thermosetting ink may be directly applied to the corresponding area through the silkscreen-printing method. The exposed portions (not illustrated) of the first outer layer circuit 571 and the second outer layer circuit 572 may be used as terminals for soldering connection with other elements. The structure 505 of FIG. 5F is subjected to post-processing such as contouring (e.g., cutting) or surface treatment, and thus the final second printed circuit board (e.g., the second printed circuit 342 in FIG. 3) may be formed. The second printed circuit board according to the structure 505 of FIG. 5F is formed in a structure in which the first outer layer circuit 571 and the second outer layer circuit 572 are electrically connected to the first circuit 541 and the second circuit 542 of the first inner layer 540 and the third circuit 552 and the fourth circuit 553 of the second inner layer 550 via the conductive material 563, but may be designed to have various other wiring forms without being limited thereto.

According to certain embodiments, referring to FIG. 3 again, the first printed circuit board 341 may also be formed according to the multilayer printed circuit board manufacturing flow described above with reference to FIGS. 4A, 4B, 4C, and 4D and FIGS. 5A, 5B, 5C, 5D, 5E, and 5F.

According to some embodiments, the second printed circuit board formed on the basis of the copper-clad laminate may be a single-side printed circuit board in which a circuit is formed on only one side or a double-sided printed circuit board in which a circuit is formed on both sides. The double-sided printed circuit board may include through holes or vias connecting upper and lower circuits.

For example, the single-sided printed circuit board may be formed through a series of flows including circuit printing, copper foil etching, resist peeling, solder mask printing, hole-processing, and contouring on the basis of a copper-clad laminate. Each process has been described in the flow of forming a multilayer printed circuit board, and a detailed description thereof will be omitted.

For example, the double-sided printed circuit board may be formed through a series of flows including hole-processing, plating, circuit printing, copper foil etching, resist peeling, solder mask printing, and contouring on the basis of a copper-clad laminate. According to some embodiments, the double-sided printed circuit board may be formed through a series of flows including hole-processing, plating, circuit printing, resist peeling, copper foil etching, solder mask printing, and contouring on the basis of a copper-clad laminate. Each process has been described in the flow of forming a multilayer printed circuit board, and a detailed description thereof will be omitted.

Figure 6:
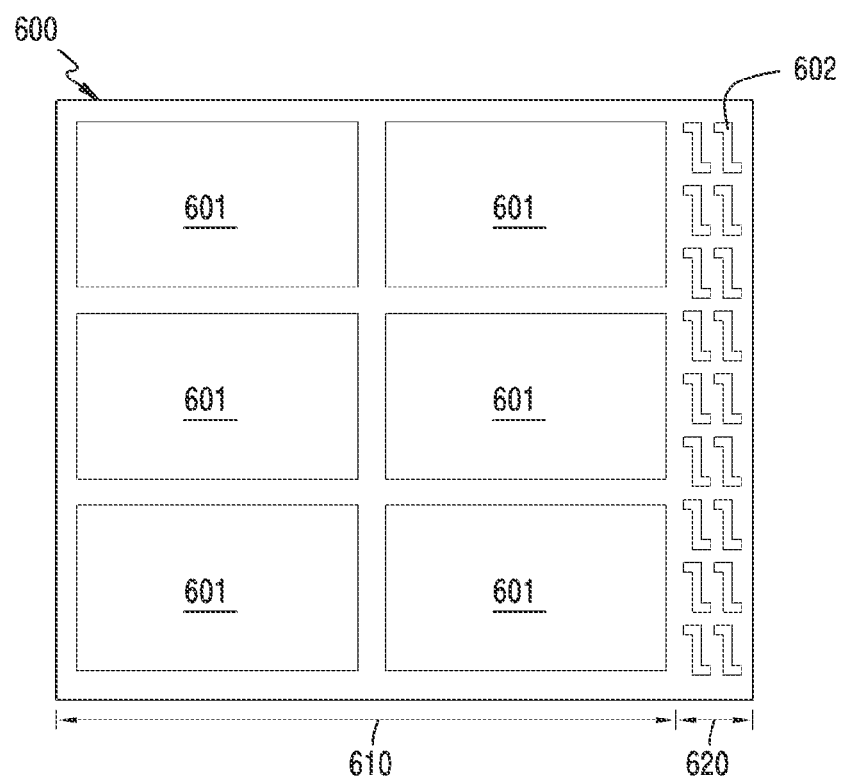
FIG. 6 is a view for explaining contouring of a printed circuit board according to certain embodiments.

FIG. 6 is a view for explaining contouring of a printed circuit board according to certain embodiments.

Referring to FIG. 6, a printed circuit board 600 may include a first portion 610 in which areas 601 corresponding to a first printed circuit board are arranged, and a second portion 620 in which areas 602 corresponding to a second printed circuit board are arranged. The printed circuit board 600 may also be formed according to, for example, the multilayer printed circuit board manufacturing flow described above with reference to FIGS. 4A, 4B, 4C, and 4D and FIGS. 5A, 5B, 5C, 5D, 5E, and 5F.

According to an embodiment, the areas 601 corresponding to the first printed circuit board and the areas 602 corresponding to the second printed circuit board may be separated from the printed circuit board 600 through the contouring. For example, press processing using a mold or a computer numerical control (CNC) type routing equipment may be utilized for the contouring. Further referring to FIG. 3, each of the areas 601 illustrated in FIG. 6 corresponds to the first printed circuit board 341 of FIG. 3, and each of the areas 602 illustrated in FIG. 6 corresponds to the second printed circuit board 342 of FIG. 3. According to an embodiment, due to the size of the original plate on which the printed circuit board 600 is formed, the second portion 620 may correspond to an area in which it is difficult to design an area corresponding to the first printed circuit board. The areas 602 corresponding to the second printed circuit board (e.g., the second printed circuit board 342 in FIG. 3) are designed using this second part 620, so that costs can be reduced.

According to some embodiments, the second printed circuit board (e.g., the second printed circuit board 342 in FIG. 3) may be formed on the basis of another original plate different from the first printed circuit board (e.g., the first printed circuit board 341 in FIG. 3).

Figure 7:
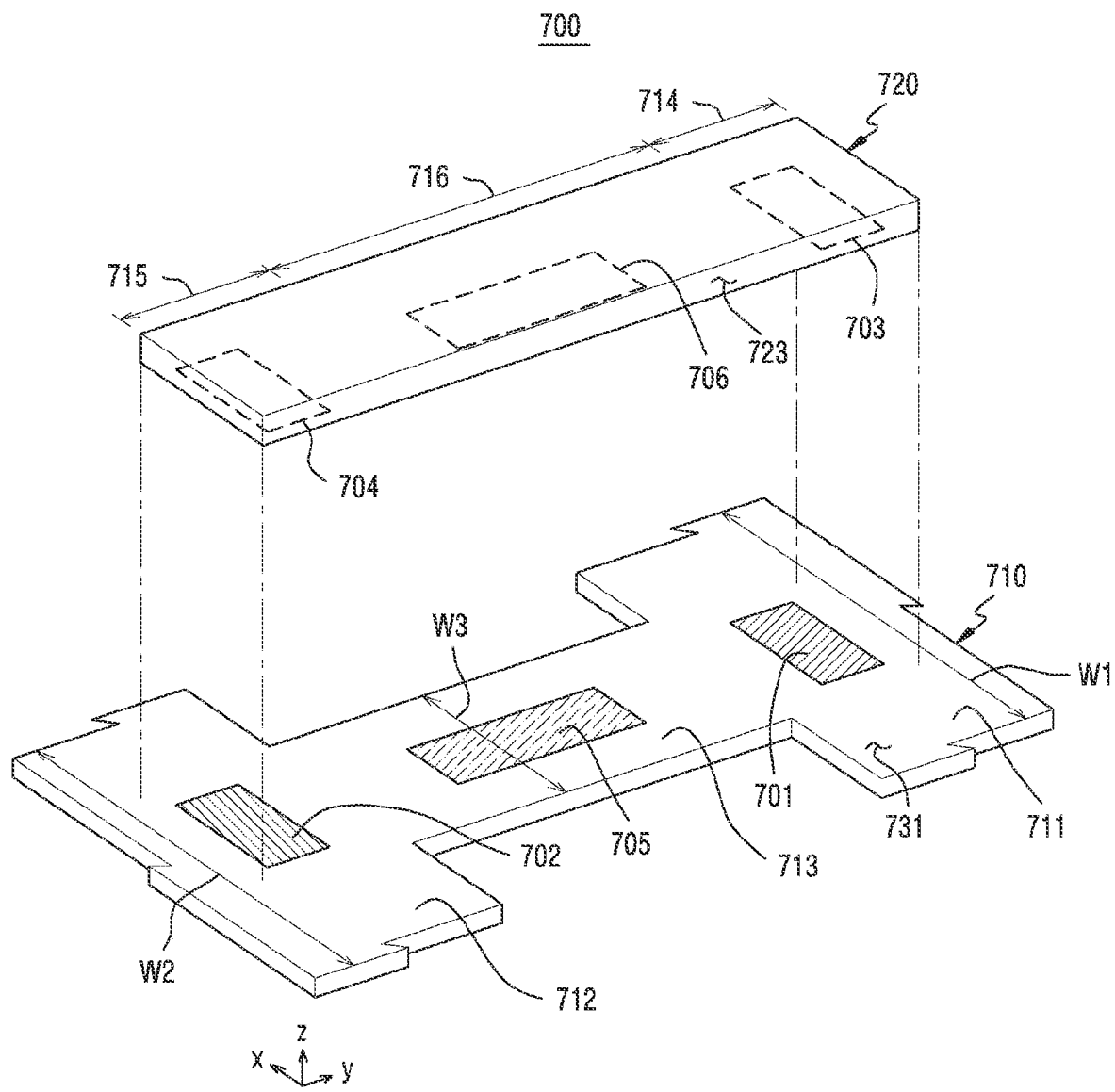
FIG. 7 is an exploded perspective view of printed circuit boards according to an embodiment.

FIG. 7 is an exploded perspective view of printed circuit boards according to an embodiment.

Referring to FIG. 7, in an embodiment, the printed circuit board 700 may include a first printed circuit board 710 and a second printed circuit board 720, which are coupled to overlap each other. The first printed circuit board 710 (e.g., the first printed circuit board 341 in FIG. 3) or the second printed circuit board 720 (e.g., the second printed circuit board 342 in FIG. 3) may also be formed according to the multilayer printed circuit board manufacturing flow described above with reference to FIGS. 4A, 4B, 4C, and 4D and FIGS. 5A, 5B, 5C, 5D, 5E, and 5F.

According to an embodiment, the first printed circuit board 710 may include a first area 711, a second area 712, and a third area 713 disposed between the first area 711 and the second area 712. The third area 713 may be formed to have a narrower width than the first area 711 or the second area 712. For example, the first area 711, the second area 712, and the third area 713 are arranged in the y-axis direction, and in the x-axis direction, the width W3 of the third area 713 may be narrower than the width W1 of the first area 711 or the width W2 of the second area 712.

According to an embodiment, the second printed circuit board 720 may include a fourth area 714, a fifth area 715, and a sixth area 716 disposed between the fourth area 714 and the fifth area 715. The second printed circuit board 720 may be coupled to overlap the first printed circuit board 710 so as to be utilized as a reinforcing member for reinforcing the rigidity of the third area 713 of the first printed circuit board 710. The first printed circuit board 710 may include a plurality of terminals 701, 702, and 705 disposed, for example, on the front face 731 thereof facing the rear face (not illustrated) of the second printed circuit board 720. The second printed circuit board 720 may include a plurality of terminals 703, 704, and 706 disposed, for example, on the rear face thereof. When the plurality of terminals 701, 702, and 705 of the first printed circuit board 710 and the plurality of terminals 703, 704, and 706 of the second printed circuit board 720 are coupled through solder, the second printed circuit board 720 may be disposed to overlap the first printed circuit board 710 and may reinforce the third area 713. For example, the third area 713 has a narrower width than the first area 711 or the second area 712, while the second printed circuit board 720 may reduce an impact or load transmitted to the third area 713.

According to an embodiment, the first printed circuit board 710 may include a first electrical terminal 701 disposed in the first area 711 and a second electrical terminal 702 disposed in the second area 712. The second printed circuit board 720 may include a third electrical terminal 703 disposed in the fourth area 714 and a fourth electrical terminal 704 disposed in the fifth area 715, and the third terminal 703 and the fourth electrical terminal 704 may be electrically connected through a circuit (not illustrated) included in the second printed circuit board 720. When the first printed circuit board 710 and the second printed circuit board 720 are coupled to each other, the first electrical terminal 701 may be coupled to the third electrical terminal 703 via solder, and the second electrical terminal 702 may be coupled to the fourth electrical terminal 704 via solder. Thereby, the first electrical terminal 701 and the second electrical terminal 702 may be electrically connected to each other through the second printed circuit board 720. According to some embodiments, the first printed circuit board 720 may include a circuit that electrically connects the first electrical terminal 701 and the second electrical terminal 702, and this circuit may extend to the third area 713.

According to an embodiment, the first printed circuit board 710 may include a first ground terminal 705 disposed in the third area 713, and the first ground terminal 705 may be electrically connected to a first ground (or a first ground circuit) included in the first printed circuit board 710 or may be a part of the first ground (or the first ground circuit). According to an embodiment, the second printed circuit board 720 may include a second ground terminal 706 disposed in the sixth area 716, and the second ground terminal 706 may be electrically connected to a second ground (or a second ground circuit) included in the second printed circuit board 720 or may be a part of the second ground (or the second ground circuit). When the first printed circuit board 710 and the second printed circuit board 720 are coupled, solder interconnecting the first ground terminal 705 and the second ground terminal 706 is disposed, by which the first ground and the second ground can be electrically connected to each other.

According to an embodiment, at least some of the first electrical terminal 701, the second electrical terminal 702, the third electrical terminal 703, the fourth electrical terminal 704, the first ground terminal 705, and the second ground terminal 706 may be conductive pads. According to some embodiments, at least some of the first electrical terminal 701, the second electrical terminal 702, the third electrical terminal 703, the fourth electrical terminal 704, the first ground terminal 705, and the second ground terminal 706 may be terminals utilizing through holes or vias, which are plated with a conductive material. In certain embodiments, electrical terminals can be conductive material disposed on a surface covering a large enough surface area to form electrical contact by physical placement of an external device.

According to certain embodiments, a side face 723 of the second printed circuit board 720 may be at least partially surrounded by a conductive material, and the conductive material may be utilized for reducing noise generated by an electronic device (e.g., the electronic device 100 in FIG. 1 or 2) or electromagnetic interference (EMI). For example, the side face 723 of the second printed circuit board 720 may be plated with a conductive material.

According to some embodiments, the first ground terminal 705 and the second ground terminal 706 may be omitted.

According to some embodiments, the first ground terminal 705 may be replaced by a first metal pad (or a first dummy pad) physically separated from a conductive portion (e.g., circuits) included in the first printed circuit board 710. The second ground terminal 706 may be replaced by a second metal pad (or a second dummy pad) physically separated from a conductive portion (e.g., circuits) included in the second printed circuit board 720. According to an embodiment, when the first printed circuit board 710 and the second printed circuit board 720 are coupled, solder may be disposed to bond the first metal pad and the second metal pad to each other. According to certain embodiments, the first metal pad and the second metal pad may be coupled to each other via various other bonding members.

According to certain embodiments, the second metal pad may be expanded to an area in which the third electrical terminal 703 is not disposed in the fourth area 714 or an area in which the fourth electrical terminal 704 is not disposed in the fifth area 715, or other metal pads disposed in these areas may be further formed. The first printed circuit board 710 may be formed to have metal pad (s) corresponding to such metal pad (s) of the second printed circuit board 720.

According to some embodiments, the third area 713 and the sixth area 716 may be coupled via various bonding members (e.g., polymer or organic adhesive layers) without the first metal pad and the second metal pad.

According to certain embodiments, various other types of first bonding portions may be formed to replace the first metal pad, and various other types of second bonds may be formed to replace the second metal pad. For example, an optical adhesive member (e.g., a material cured by specified light) or a thermosetting material may be disposed between the first bonding portion and the second bonding portion. According to certain embodiments, the adhesive member may be designed to be included in the first or second bonding portion. According to some embodiments, the first bonding portion and the second bonding portion may be coupled through bolt fastening.

Figure 8:
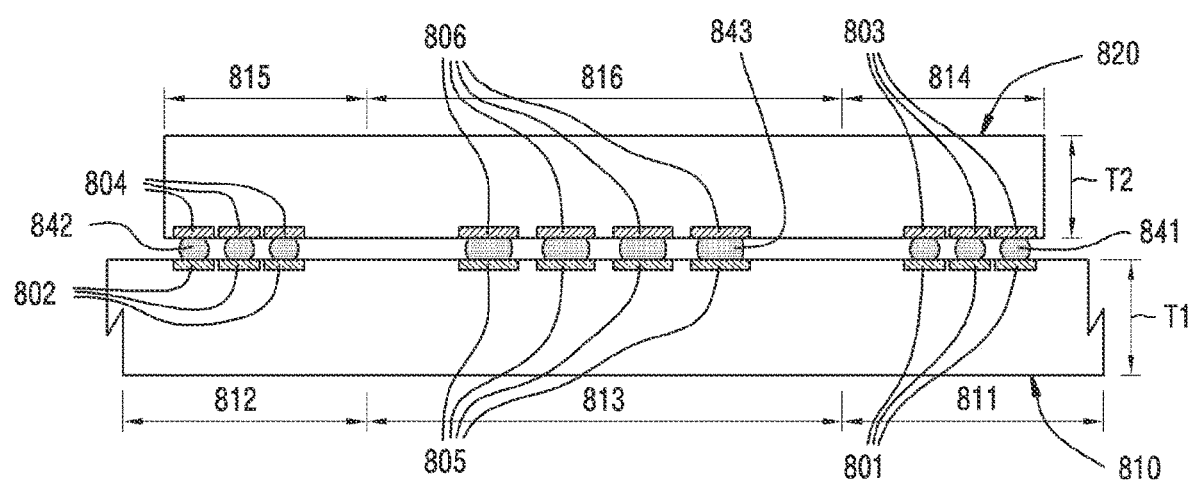
FIG. 8 is a cross-sectional view of a printed circuit board according to an embodiment.

FIG. 8 is a cross-sectional view illustrating the coupled state of a first printed circuit board and a second printed circuit board according to an embodiment.

Referring to FIG. 8, in an embodiment, a first printed circuit board 810 (e.g., the first printed circuit board 341 in FIG. 3 or the first printed circuit board 710 in FIG. 7) and a second printed circuit board 820 (e.g., the second printed circuit board 342 in FIG. 3 or the second printed circuit board 720 in FIG. 7) may be coupled to overlap each other. The first printed circuit board 810 or the second printed circuit board 820 may also be formed according to the multilayer printed circuit board manufacturing flow described above with reference to FIGS. 4A, 4B, 4C, and 4D and FIGS. 5A, 5B, 5C, 5D, 5E, and 5F.

According to an embodiment, the first printed circuit board 810 may include a first area 811, a second area 812, and a third area 813 disposed between the first area 811 and the second area 812. The second printed circuit board 820 may include a fourth area 814, a fifth area 815, and a sixth area 816 disposed between the fourth area 814 and the fifth area 815. The fourth area 814 may be disposed to at least partially overlap the first area 811, the fifth area 815 may be disposed to at least partially overlap the second area 812, and the sixth area 816 may be disposed to at least partially overlap the third area 813.

According to an embodiment, the first printed circuit board 810 may include first electrical terminals 801 (e.g., the first electrical terminal 701 in FIG. 7) disposed in the first area 811, second electrical terminals 802 (e.g., the second electrical terminal 702 in FIG. 7) disposed in the second area 812, and first ground terminals 805 (e.g., the first ground terminal 705 in FIG. 7) disposed in the third area 813. The second printed circuit board 820 may include third electrical terminals 803 (e.g., the third electrical terminal 703 in FIG. 7) disposed in the fourth area 814, fourth electrical terminals 804 (e.g., the fourth electrical terminal 704 in FIG. 7) disposed in the fifth area 815, and second ground terminals 806 (e.g., the second ground terminal 706 in FIG. 7) disposed in the sixth area 816. The first electrical terminals 801 may be coupled to the third electrical terminals 803 via solder 841, the second electrical terminals 802 may be coupled to the fourth electrical terminals 804 via solder 842, and the first ground terminals 805 may be coupled to the second ground terminals 806 via solder 843. According to an embodiment, the third electrical terminals 803 and the fourth electrical terminals 804 may be electrically connected by a circuit included in the second printed circuit board 820, whereby the first electrical terminals 801 and the second electrical terminals 802 may be electrically connected through the second printed circuit board 820. The first ground terminals 805 may be electrically connected to a first ground included in the first printed circuit board 810, and the second ground terminals 806 may be electrically connected to a second ground included in the second printed circuit board 820.

The amount of soldering material in solders 841, 842, and 843 or the gaps between the electrical terminals 803, 804, and 806 may an amount limited to prevent connection to each other (e.g., to form a solder bridge) when the first printed circuit board 810 and the second printed circuit board 820 are coupled. According to certain embodiments, it is natural that various other conductive bonding materials may be applied to replace the solders 841, 842, and 843, in which case the terminals of the first printed circuit board 810 and the second printed circuit board 820 may also be modified differently.

According to certain embodiments, the thickness T1 of the first printed circuit board 810 and the thickness T2 of the second printed circuit board 820 may be the same as or different from each other.

According to certain embodiments, the number of inner layers (e.g., structure 440 in FIG. 4D) included in the first printed circuit board 810 and the number of inner layers included in the second printed circuit board 820 may be the same as or different from each other.

According to some embodiments, the first ground terminal 805 and the second ground terminal 806 may be omitted.

Figure 9:
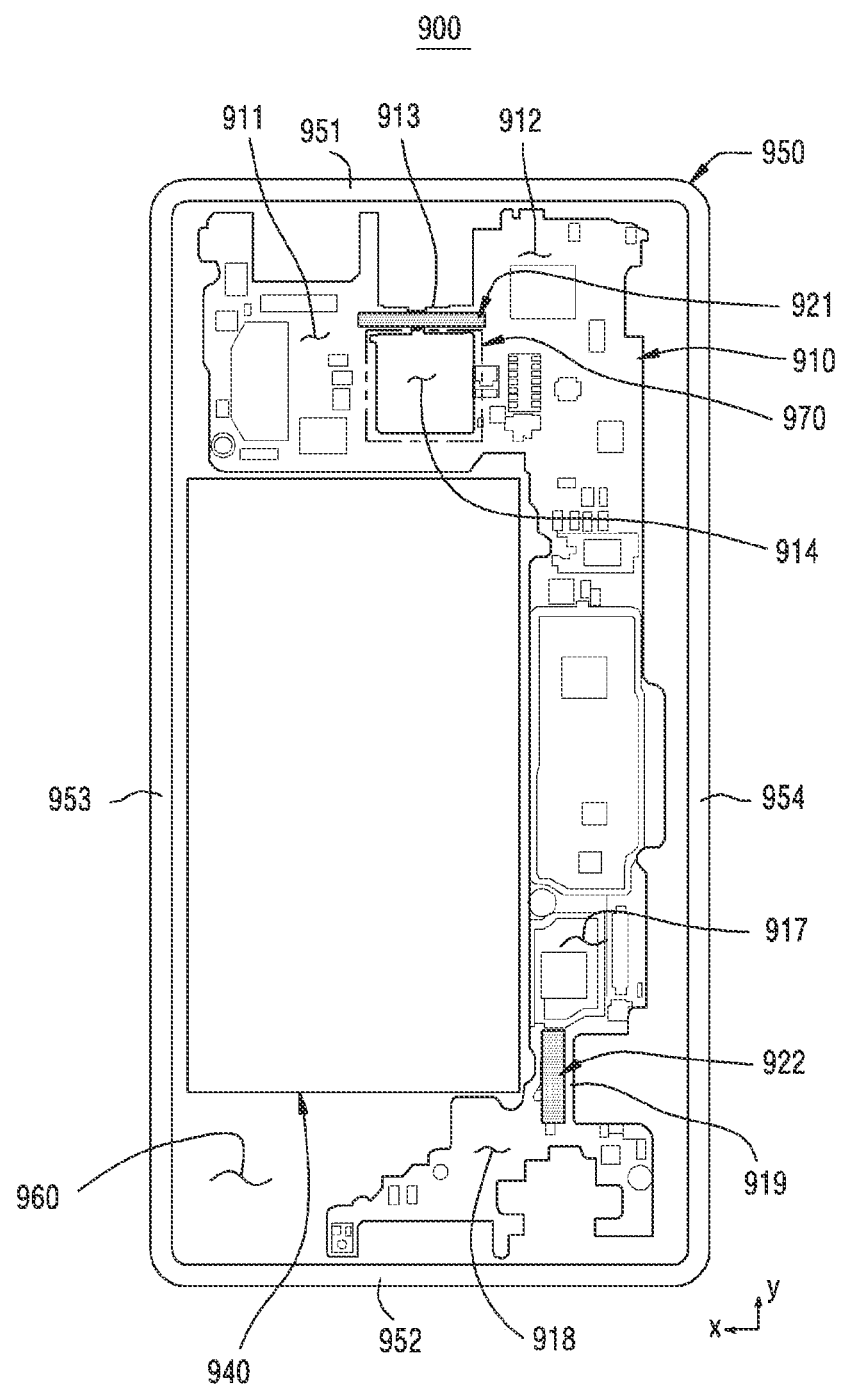
FIG. 9 is a view illustrating an electronic device including overlappingly disposed printed circuit boards according to certain embodiments.

FIG. 9 is a view illustrating an electronic device including overlapping printed circuit boards according to certain embodiments.

Referring to FIG. 9, in an embodiment, an electronic device 900 (e.g., the electronic device 100 in FIG. 1) may include a first printed circuit board 910, and a second printed circuit board 921 and a third printed circuit board 922, which are coupled to overlap the first printed circuit board 910. According to an embodiment, the first printed circuit board 910 may include the first printed circuit board 710 of FIG. 7 or the first printed circuit board 810 of FIG. 8, and the second and third printed circuit boards 921 and 922 may include the second printed circuit board 720 of FIG. 7 or the second printed circuit board 820 of FIG. 8.

According to one embodiment, the first printed circuit board 910 may be integrally formed with a side bezel structure 950 (e.g., the side bezel structure 310 in FIG. 3) of the electronic device 900, or may be coupled to a support member 960 (e.g., the first support member 311 in FIG. 3) connected to the side bezel structure 950. The side bezel structure 950 may include first to fourth side face member 951 to 954. The first side member 951 may be disposed parallel to the second side member 952 in the y-axis direction at a distance from the second side member 952. The third side members 953 may be disposed parallel to the fourth side member 954 in the x-axis direction at a distance from the fourth side member 954. According to an embodiment, a connection portion between the first side member 951 and the third side member 953, a connection portion between the first side member 951 and the fourth side member 954, a connection portion between the second side member 952 and the third side member 953, or a connection portion between the second side member 952 and the fourth side member 954 may provide a smoothly curved side face.

According to an embodiment, the first printed circuit board 910 may include an opening 914 that supports the placement of a camera 970 (e.g., the second camera device 112 in FIG. 2). The camera 970 is an integrated component including a lens, an image sensor, and/or an image signal processor, and is inserted into the opening 914. The camera 970 may include a flexible printed circuit (FPCB) electrically connected to the first printed circuit board 910. According to an embodiment, the first printed circuit board 910 may include a third area 913 (e.g., the third area 713 in FIG. 7) disposed between the opening 914 in the peripheral areas defining the opening 914 and the first side member 951. According to an embodiment, the first printed circuit board 910 may include a first area 911 (e.g., the first area 711 in FIG. 7) disposed between the third area 913 and the third side member 953, and a second area 912 (e.g., the second area 712 in FIG. 7) disposed between the third area 913 and the fourth side member 954. According to an embodiment, the first area 911 and the second area 912 may extend to define an opening 914. The third area 913 connects the first area 911 and the second area 912, and according to an embodiment, the third area 913 may have a narrower width than the first area 911 or the second area 912 in the y-axis direction (e.g., the direction between the first side member 951 and the second side member 952).

According to an embodiment, the first printed circuit board 910 may include a first electrical terminal (e.g., the first electrical terminal 701 in FIG. 7) disposed in the first area 911 and a second electrical terminal (e.g., the second electrical terminal 702 in FIG. 7) disposed in the second area 912. The first printed circuit board 910 may include a first ground terminal (e.g., the first ground terminal 705 in FIG. 7) disposed in the third area 913. The second printed circuit board 921 may include, on the rear face thereof, a third electrical terminal (e.g., the third electrical terminal 703 in FIG. 7) coupled with the first electrical terminal, a fourth electrical terminal (e.g., the fourth electrical terminal 704 in FIG. 7) coupled with the second electrical terminal, and a second ground terminal (e.g., the second ground terminal 706 in FIG. 7) coupled with the first ground terminal.

According to an embodiment, the first electrical terminal, the first ground terminal, and the second electrical terminal may be arranged in the x-axis direction (e.g., the direction between the third side member 953 and the fourth side member 954). The second printed circuit board 921 may be in a form such that it is extended to overlap the third area 913 when connected to the first electrical terminal and the second electrical terminal. According to certain embodiments, the first electrical terminal or the second electrical terminal may be disposed in the vicinity of the third area 913 (e.g., within about 20 mm).

According to an embodiment, the first electrical terminal and the second electrical terminal may be electrically connected to each other through the second printed circuit board 921. According to an embodiment, the third area 913 may be designed so as to obviate wiring for electrically connecting the first electrical terminal and the second electrical terminal, or according to some embodiments, so as to include wiring for connecting the first electrical terminal and the second electrical terminal.

According to certain embodiments, the first electrical terminal may be electrically connected to a first component mounted on the first area 911, and the second electrical terminal may be electrically connected to a second component mounted on the second area 912.

According to an embodiment, the second printed circuit board 921 is capable not only of reinforcing the third area 913 of the first printed circuit board 910, but also of being used as a wiring area for supporting the first printed circuit board 910 without increasing the width of the third area 913 or without designing the third area 913 so as to increase the wiring density.

According to an embodiment, the first printed circuit board 910 may include a seventh area 917 extending from the second area 912 to a space between the battery 940 (e.g., the battery 350 in FIG. 3) and the fourth side member 954, an eighth area 918 disposed on the side of the second side member 952, and a ninth area 919 between the seventh area 917 and the eighth area 918. In the x-axis direction, the ninth area 919 (e.g., the third area 713 in FIG. 7) may have a width narrower than that of the seventh area 917 (e.g., the first area 711 in FIG. 7) or the eighth area 918 (e.g., the second area 712 in FIG. 7). According to an embodiment, the third printed circuit board 922 may be coupled to overlap the first printed circuit board 910 and may be disposed to overlap the ninth area 919. The third printed circuit board 922 is capable not only of reinforcing the ninth area 919 of the first printed circuit board 910, but also of being used as a wiring area for supporting the first printed circuit board 910 without increasing the width of the ninth area 919 or without designing the ninth area 919 to increase the wiring density.

According to an embodiment, the ninth area 919 may be a portion on which a motor is mounted. The motor may be for causing the electronic device to mechanically oscillate. For example, the motor may be disposed between the ninth area 919 and the support member 960.

Figure 10:
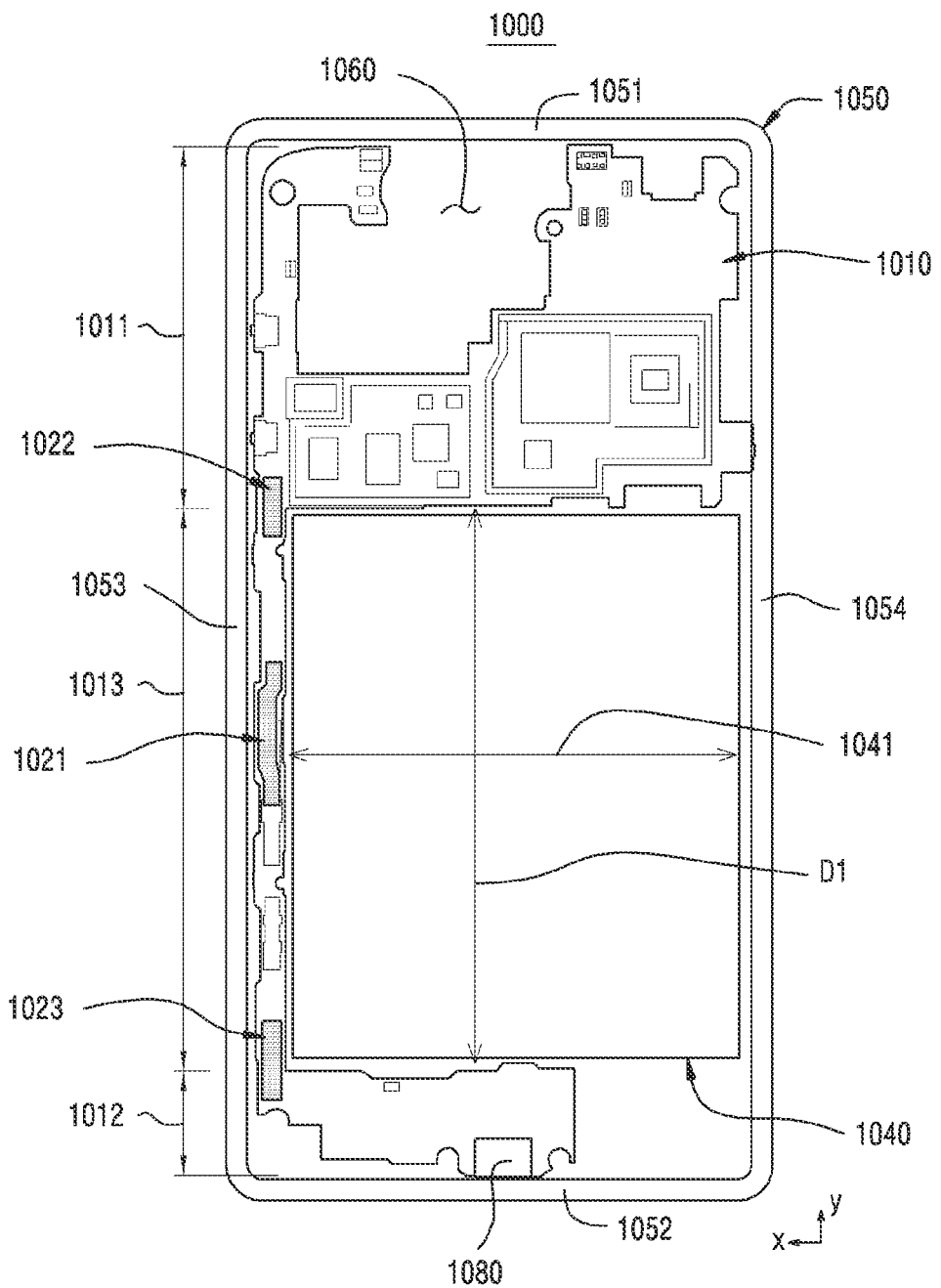
FIG. 10 is a view illustrating an electronic device including overlapping printed circuit boards according to certain embodiments.

FIG. 10 is a view illustrating an electronic device including overlapping printed circuit boards according to certain embodiments.

Referring to FIG. 10, in an embodiment, an electronic device 1000 (e.g., the electronic device 100 in FIG. 1) may include a first printed circuit board 1010, and one or more second printed circuit boards 1021, 1022, and 1023, which are coupled to overlap the first printed circuit board 1010. The first printed circuit board 1010 may include, for example, a first area 1011 (e.g., the first area 711 in FIG. 7), a second area 1012 (e.g., the second area 712 in FIG. 7), which is spaced apart from the first area 1011 by a distance D1, and a third area 1013 (e.g., the third area 713 in FIG. 7) connecting the first area 1011 and the second area 1012.

According to an embodiment, the first printed circuit board 1010 may include the first printed circuit board 710 of FIG. 7 or the first printed circuit board 810 of FIG. 8, and the second printed circuit boards 1021, 1022, and 1023 may include the second printed circuit board 720 of FIG. 7 or the second printed circuit board 820 of FIG. 8.

According to an embodiment, the first printed circuit board 1010 may be integrally formed with a side bezel structure 1050 (e.g., the side bezel structure 310 in FIG. 3) of the electronic device (e.g., the electronic device 100 in FIG. 1 or 2), or may be coupled to a support member 1060 (e.g., the first support member 311 in FIG. 3) connected to the side bezel structure 1050. The side bezel structure 1050 may include a first side member 1051 (e.g., the first side member 951 in FIG. 9), a second side member 1052 (e.g., the second side member 952 in FIG. 9), a third side member 1053 (e.g., the third side member 953 in FIG. 9), and a fourth side member 1054 (e.g., the fourth side member 954 in FIG. 9). According to an embodiment, a battery 1040 (e.g., the battery 350 in FIG. 3) may be disposed between the first area 1011 and the second area 1012, and between the third area 1013 and the fourth side member 1054. The third area 1013 may have a shape protruding and extending from the first area 1011 or the second area 1012 to a space between the battery 1040 and the third side member 1053. In a direction oriented from the third side member 1053 toward the fourth side member 1054 (e.g., the x-axis direction), the third area 1013 may have a width narrower than that of the first area 1011 or the second area 1012.

According to an embodiment, the second printed circuit boards 1021, 1022, and 1023 may include a printed circuit board 1021 coupled to overlap the third area 1013, a printed circuit board 1022 coupled to overlap the first area 1011 and the third area 1013, or a printed circuit board 1023 coupled to overlap the second area 1012 and the third area 1013. The second printed circuit boards 1021, 1022, and 1023 may be coupled to the first printed circuit board 1010 via solder, so that the second printed circuit boards 1021, 1022, and 1023 are able to reinforce the third area 1013. Since the third area 1013 has a narrower width than that of the first area 1011 or the second area 1012, the third area 1013 may be vulnerable to breakage due to impact or load. However, the second printed circuit boards 1021, 1022, and 1023 are able to suppress the impact or load from being applied to the third area 1013 and improve rigidity. Since the third area 1013 can have a narrower width, substantial rigidity, it is possible to secure a space 1041 required for disposing the battery 1040 therein. According to certain embodiments, some of the second printed circuit boards 1021, 1022, and 1023 may be omitted.

According to certain embodiments, the third area 1013 of the first printed circuit board 1010 may include portions formed like the first area 711, the second area 712, and the third area 713 of FIG. 7. The second printed circuit board 1021 may be coupled to the third area 1013 of the first printed circuit board 1010, like the second printed circuit board 720 of FIG. 7.

According to some embodiments, at least one of the second printed circuit boards 1021, 1022, and 1023 may be disposed between the support member 1060 and the first printed circuit board 1010.

For example, electronic components may transmit or receive signals or data through signal lines included in the first printed circuit board 1010. Due to a current flow, an electric field is formed in the signal lines, and this electric field causes electromagnetic interference (EMI) that interferes with the normal operation of the electronic components by applying noise to a nearby electronic component or signals transmitted to another nearby signal line. In order to suppress such electromagnetic interference, the signal lines may be designed to be located as far away as possible from other nearby signal lines and electronic components, or may be designed to further increase the volume thereof. It may difficult to design the third area 1013 to have an expanded width due to the limited space between the third side member 1053 and the battery 1040. Accordingly, in consideration of electromagnetic interference, it may be difficult to design the third area 1013 such that the number of signal lines in the third area 1013 is increased (e.g., the wiring density is increased) or such that the volume of the signal lines included in the third area 1013 is increased. In order to overcome such design constraints, according to an embodiment, the second printed circuit boards 1021, 1022, and 1023 may be utilized as signal lines for data transmission/reception.

As another example, current may be set to be equal to or lower than the value that can safely flow in the signal lines (e.g., maximum current). The maximum current is a value allowed by the electronic components connected to the signal lines, and the signal lines can be designed to allow this maximum current. For example, when current flows through a signal line, heat may be generated due to the electrical resistance of the signal line. The heat raises the temperature of the signal line, and when the temperature rises above a certain limit, the signal line may be damaged (e.g., weakened or broken). As another example, incineration may be caused in the signal line and in the vicinity of the signal line due to the heat generated from the signal line. In order to prevent the signal line from being damaged due to the heat generated when the current flows through the signal line, the signal line may include a material having electrical resistance as low as possible, or may be designed to have as large a volume as possible. According to an embodiment, a connector (e.g., a USB connector) 1080 may be disposed in the second area 1012. When current is supplied from the external power supply through the connector 1080, the current may flow to the first area 1011 through the second area 1012 and the third area 1013. It may difficult to design the third area 1013 to have an expanded width due to the limited space between the third side member 1053 and the battery 1040, whereby it may be difficult to design a signal line included in the third area 1013 to have an expanded volume. According to an embodiment, in order to overcome such design constraints, according to an embodiment, the second printed circuit boards 1021, 1022, and 1023 may be utilized as signal lines for current transmission/reception.

According to an embodiment, second grounds (or ground circuits) included in the second printed circuit boards 1021, 1022, and 1023 may be electrically connected to a first ground included in the first printed circuit board 1010. Since the grounds are expanded by the second printed circuit boards 1021, 1022, and 1023, performance in electromagnetic interference (EMI) may also be improved.

Figure 11A:
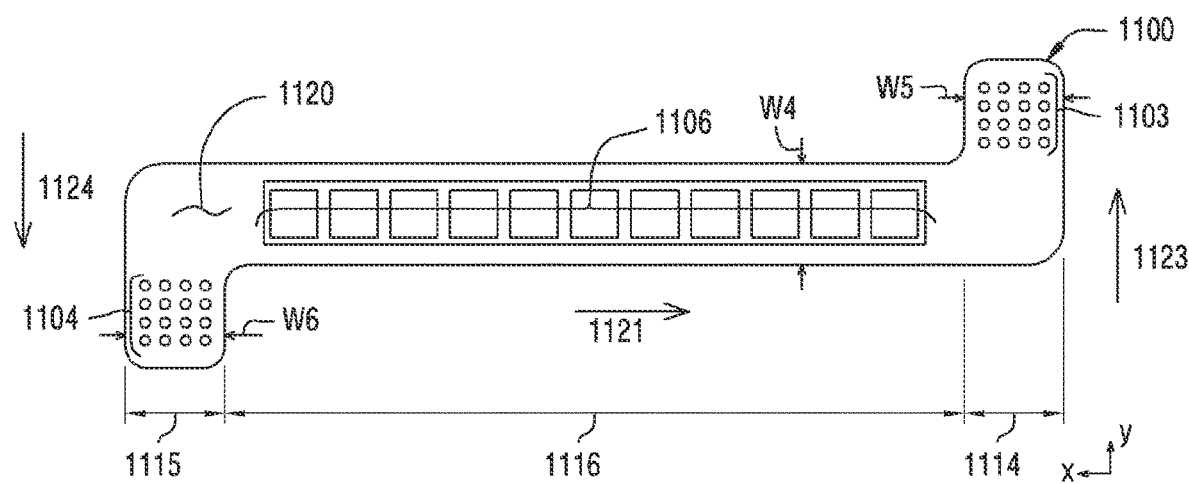
FIG. 11A is a front view of a second printed circuit board according to certain embodiments.
Figure 11B:
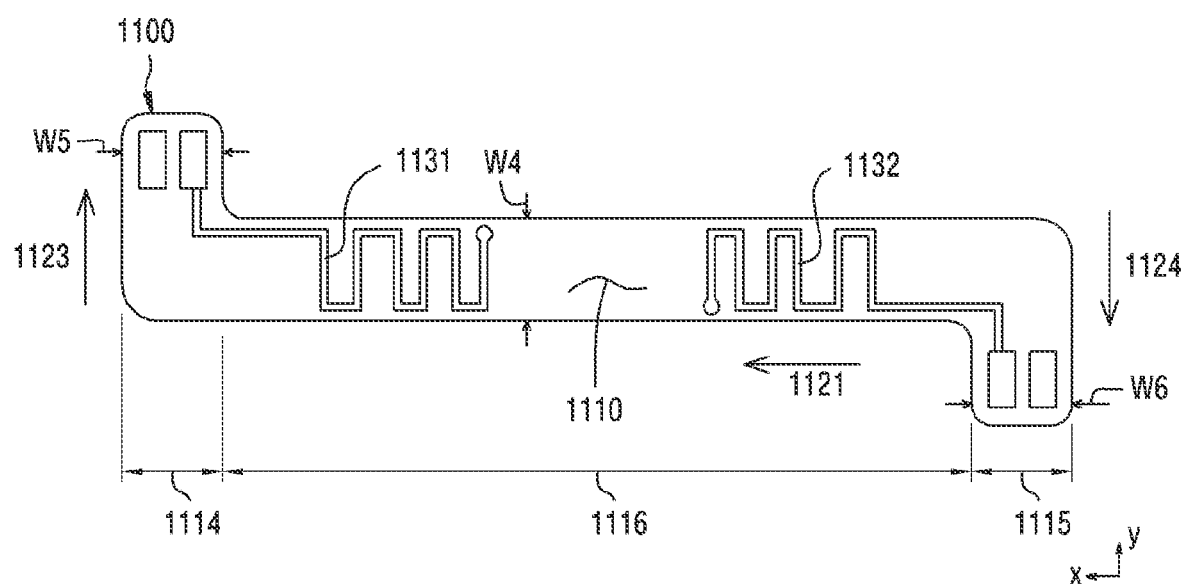
FIG. 11B is a rear view of the second printed circuit board of FIG. 11A.

FIG. 11A is a front view of a second printed circuit board according to certain embodiments. FIG. 11B is a rear view of the second printed circuit board of FIG. 11A.

Referring to FIGS. 11A and 11B, a second printed circuit board 1100 (e.g., the second printed circuit board 720 in FIG. 7) according to an embodiment may include a fourth area 1114, a fifth area 1115, and a sixth area 1116 disposed between the fourth area 1114 and the fifth area 1115. According to an embodiment, the sixth area 1116 may extend straight in a first direction 1121 (e.g., the x-axis direction), the fourth area 1114 may extend in a third direction 1123 perpendicular to the first direction 1121, and the fifth area 1115 may extend in a fourth direction 1124 opposite the second direction 1122. According to certain embodiments, the width W4 of the sixth area 1116 extending in the second direction 1123 or the third direction 1124 may be the same as or different from the width W5 of fourth area 1114 extending in the first direction 1121 or the width W6 of the fifth area 1115 extending in the first direction 1121. According to certain embodiments, the width W5 of the fourth area 1114 may be the same as or different from the width W6 of the fifth area 1115.

According to some embodiments, the fourth area 1114 or the fifth area 1115 may be designed to extend at an acute or obtuse angle relative to the sixth area 1116.

Referring to FIG. 11A, in an embodiment, the second printed circuit board 1100 may include a plurality of terminals disposed on the rear face 1120 (or the back side). The plurality of terminals of the second printed circuit board 1100 may be coupled to a plurality of terminals formed on the first printed circuit board (e.g., the first printed circuit board 341 in FIG. 3, the first printed circuit board 910 in FIG. 9, or the first printed circuit board 1010 in FIG. 10) via solder, whereby the second printed circuit board may be coupled to overlap the first printed circuit board. According to an embodiment, the second printed circuit board 1100 may include third electrical terminals 1103 (e.g., the third electrical terminals 803 in FIG. 8) disposed in the fourth area 1114, fourth electrical terminals 1104 (e.g., the fourth electrical terminals 804 in FIG. 8) disposed in the fifth area 1115, and second ground terminals 1106 (e.g., the second ground terminals 804 in FIG. 8) disposed in the sixth area 1116.

According to an embodiment, the third electrical terminals 1103 are disposed in a portion of the fourth area 1114 that protrudes in the second direction 1122 with respect to the sixth area 1116, and the fourth electrical terminals 1104 may be disposed in a portion of the fifth area 1115, which protrudes in the third direction 1123 with respect to the sixth area 1116.

According to an embodiment, as illustrated in the drawing, the third electrical terminals 1103 or the fourth electrical terminals 1104 may be terminals utilizing through holes or vias plated with a conductive material. According to some embodiments, the third electrical terminals 1103 or the fourth electrical terminals 1104 may be designed as conductive pads.

According to an embodiment, as illustrated in the drawing, the second ground terminals 1106 may be formed as conductive pads. According to some embodiments, the second ground terminals 1106 may be designed as terminals that utilize through holes or vias plated with a conductive material.

According to an embodiment, as illustrated in the drawing, the second ground terminals 1106 may be arranged in a row in the first direction 1121. According to some embodiments, the second ground terminals may be arranged in two or more rows, in which case the width W4 of the sixth area 1116 may be increased. According to some embodiments, when the width W4 of the sixth area 1116 is maintained, the size of or spacing between the second ground terminals may be reduced so that the second ground terminals may be arranged in two or more rows.

According to an embodiment, the third electrical terminals 1103 and the fourth electrical terminals 1104 may be electrically connected through a circuit included in the second printed circuit board 1100. The second ground terminals 1106 may be electrically connected to a ground (or a ground circuit) included in the second printed circuit board 110, or may be a part of the ground (or the ground circuit).

Referring to FIG. 11B, in an embodiment, the second printed circuit board 1100 may include circuits 1131 and 1132 disposed on the front face 1110 thereof, and these circuits 1131 and 1132 may be utilized as antennas. An antenna may be defined as an element capable of converting an electromagnetic wave for transmission into a free space wave, or converting a free space wave for reception into an electromagnetic wave. According to an embodiment, the first printed circuit board (e.g., the first printed circuit board 341 in FIG. 3) to which the second printed circuit board 1100 is overlappingly coupled may include a communication circuit (e.g., a communication module). The communication circuit may be electrically connected to the second printed circuit board 1100. The communication circuit may perform various types of communication using circuits 1131 and 1132 of the second printed circuit board 1100.

According to some embodiments, the circuits 1131 and 1132 of the second printed circuit board 1100 may be utilized as antenna-matching circuits. For example, the first printed circuit board (e.g., the first printed circuit board 341 in FIG. 3) to which the second printed circuit board 1100 is overlappingly coupled may include a frequency adjustment circuit. The frequency adjustment circuit may adjust antenna impedance using the circuits 1131 and 1132 of the second printed circuit board 1100.

According to certain embodiments, antennas may be designed in various forms at various locations on the second printed circuit board 1100 on the basis of the radiation characteristics or impedance thereof.

Figure 12:
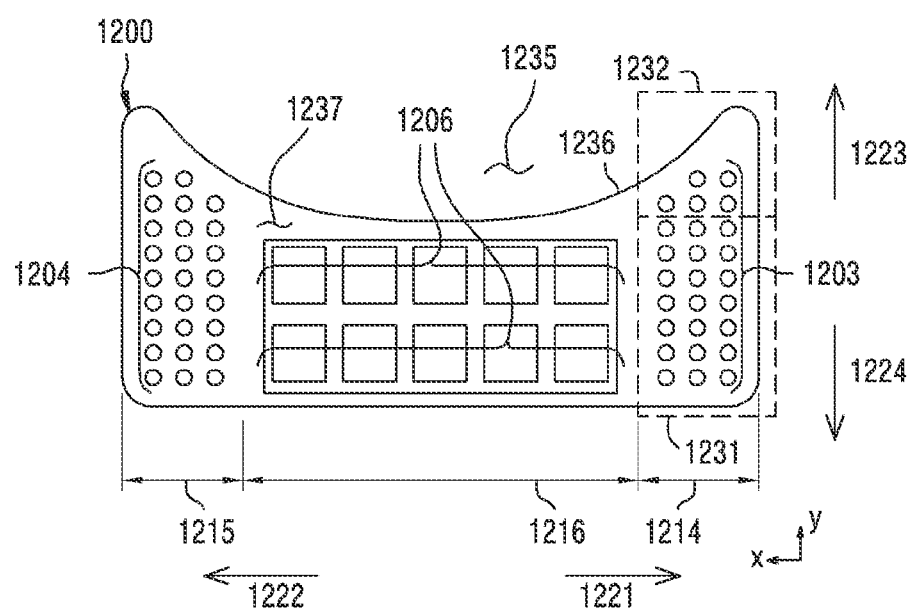
FIG. 12 is a view illustrating a second printed circuit board according to certain embodiments.

FIG. 12 is a view illustrating a second printed circuit board according to certain embodiments.

Referring to FIG. 12, a second printed circuit board 1200 (e.g., the second printed circuit board 720 in FIG. 7) according to an embodiment may include a fourth area 1214, a fifth area 1215, and a sixth area 1216 disposed between the fourth area 1214 and the fifth area 1215. The second printed circuit board 1200 may include a face 1237 facing the first printed circuit board when the second printed circuit board 1200 is coupled to overlap the first printed circuit board (e.g., the first printed circuit board 341 of FIG. 3), and a plurality of terminals 1203, 1204, and 1206 may be disposed on the face 1237. The sixth area 1216 extends in a first direction 1216 and may include second ground terminals 1206 (e.g., the second ground terminal 706 in FIG. 7). The fourth area 1214 may include a first portion 1231 extending in the first direction 1221 from the sixth area 1216 and a second portion 1232 extending in the third direction 1223 perpendicular to the first direction 1221 to protrude with respect to the sixth area 1216. Some of the third electrical terminals 1203 (e.g., the third electrical terminal 703 in FIG. 7) may be disposed in the first portion 1231, and some of the third electrical terminals 1203 may be disposed in the second portion 1232. The fifth area 1215 may be formed symmetrically with the fourth area 1214, and may include fourth electrical terminals 1204 (e.g., the fourth electrical terminal 704 in FIG. 7). The third electrical terminals 1203 and the fourth electrical terminals 1204 may be electrically connected through a circuit included in the second printed circuit board 1200, and the second ground terminals 1206 may be electrically connected to a ground circuit included in the second printed circuit board 1200.

According to an embodiment, the fourth area 1214, the fifth area 1215, and the sixth area 1216 may form a space portion 1235, which is recessed in a fourth direction 1224 opposite a third direction 1223. When the second printed circuit board 1200 is coupled to overlap the first printed circuit board (e.g., the first printed circuit board 341 in FIG. 3), at least one component mounted on the first printed circuit board may be placed in the space 1235. According to an embodiment, the side face of the second printed circuit board 1200, which forms the space 1235, may be formed as a smoothly curved face 1236.

According to certain embodiments, the shape of the second printed circuit board and the arrangement structure of the terminals of the second printed circuit board may be variously designed according to the corresponding area of the first printed circuit board.

Figure 13:
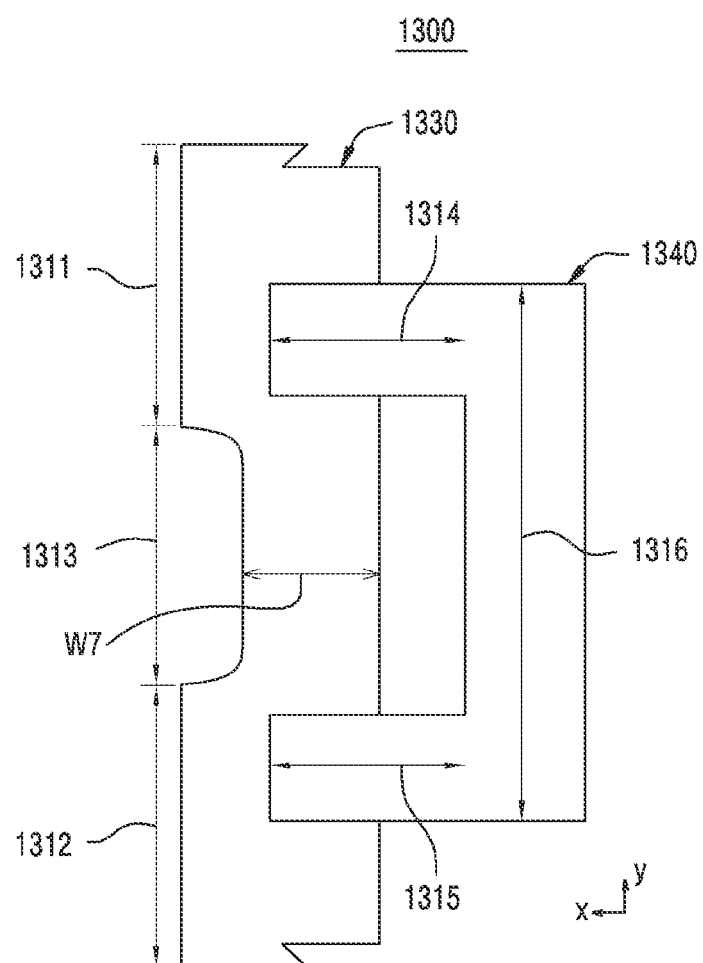
FIG. 13 is a view illustrating a printed circuit board according to certain embodiments.

FIG. 13 is a view illustrating a printed circuit board according to certain embodiments.

Referring to FIG. 13, in an embodiment, a printed circuit board 1300 may include a fourth printed circuit board 1330 (e.g., the first printed circuit board 710 in FIG. 7) and a fifth printed circuit board 1340 (e.g., the second printed circuit board 720 in FIG. 7), and the fifth printed circuit board 1340 may be coupled such that a part of the fifth printed circuit board 1340 overlaps the fourth printed circuit board 1330. According to an embodiment, the fourth printed circuit board 1330 may include a first area 1311, a second area 1312, and a third area 1313 disposed between the first area 1311 and the second area 1312. According to an embodiment, the fifth printed circuit board 1340 may include a fourth area 1314, a fifth area 1315, and a sixth area 1316 disposed between the fourth area 1314 and the fifth area 1315. The sixth area 1316 is separated from the fourth printed circuit board 1330, the fourth area 1314 extending from a first position of the sixth area 1316 is coupled to the first area 1311 of the fourth printed circuit board 1330, and the fifth area 1315 extending from a second position of the sixth area 1316 may be coupled to the second area 1312 of the fourth printed circuit board 1330. A portion of the fourth area 1314, which overlaps the fourth printed circuit board 1330, and a portion of the fifth area 1315, which overlaps the fourth printed circuit board 1330, may include at least one terminal coupled to the fourth printed circuit board 1330 via a conductive bonding material such as solder.

According to an embodiment, the fifth printed circuit board 1340 coupled to the fourth printed circuit board 1330 may reinforce the fourth printed circuit board 1330. For example, the third area 1313 may be formed to have a width W7 narrower than that of the first area 1311 or the second area 1312, and the fifth printed circuit board 1340 may have a resistance structure to bear an impact or load transmitted to the third area 1313. In addition, the fifth printed circuit board 1340 may be utilized as a wiring area that supports the fourth printed circuit board 1330. It is possible to reinforce the third area 1313 and secure a wiring area by the fifth printed circuit board 1340 without increasing the width of the third area 1313 or without designing the third area 1310 so as to increase the wiring density.

Figure 14:
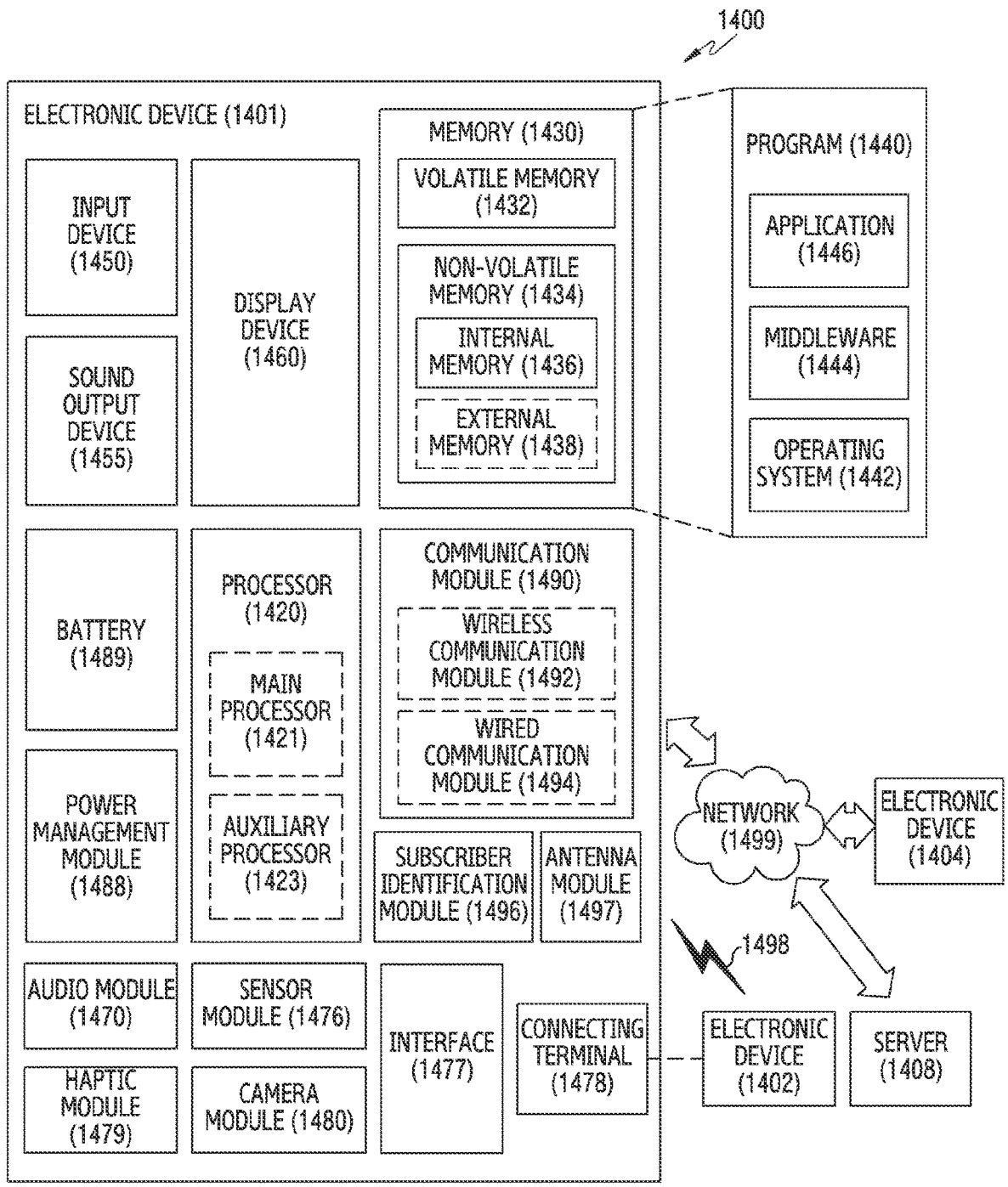
FIG. 14 is a block diagram of an electronic device, including overlapping printed circuit boards, within a network environment according to certain embodiments.

FIG. 14 is a block diagram of an electronic device 1401 (e.g., the electronic device 100 in FIG. 1 or 2, or the electronic device 300 in FIG. 3), including overlappingly disposed printed circuit boards, in a network environment 1400, according to certain embodiments. Referring to FIG. 14, the electronic device 1401 in the network environment 1400 may communicate with an electronic device 1402 via a first network 1498 (e.g., a short-range wireless communication network), or may communicate with an electronic device 1404 or a server 1408 via a second network 1499 (e.g., a long-range wireless communication network). According to one embodiment, the electronic device 1401 may communicate with the electronic device 1404 via the server 1408. According to an embodiment, the electronic device 1401 may include a processor 1420, a memory 1430, an input device 1450, a sound output device 1455, a display device 1460 (e.g., the display 101 in FIG. 1 or the display 330 in FIG. 3), an audio module 1470 (e.g., the audio module 103, 107 or 114 in FIG. 1 or 2), a sensor module 1476 (e.g., the sensor module 104 in FIG. 1 or the sensor module 119 in FIG. 2), an interface 1477, a haptic module 1479, a camera module 1480 (e.g., the first camera device 105, the second camera device 112, and/or the flash 113 of FIG. 1 or 2) (e.g., the camera module 970 in FIG. 9), a power management module 1488, a battery 1489 (e.g., the battery 350 in FIG. 3, the battery 940 in FIG. 9, or the battery 1040 in FIG. 10), a communication module 1490, a subscriber identification module 1496, and an antenna module 1497. In some embodiments, among these components, at least one component (e.g., the display device 1460 or the camera module 1480) may be eliminated from the electronic device 1401 or other components may be added to the electronic device 101. In some embodiments, some of these components may be implemented as a single integrated circuit. For example, the sensor module 1476 (e.g., a fingerprint sensor, an iris sensor, or an illuminance sensor) may be implemented in the state of being embedded in the display device 1460 (e.g., a display).

The processor 1420 may control one or more other components (e.g., a hardware or software component) of the electronic device 1401, which are connected to the processor 1420, and may perform various data processing or arithmetic operations by executing, for example, software (e.g., a program 1440). According to an embodiment, as a part of such data processing or operations, the processor 1420 may load instructions or data received from another component (e.g., the sensor module 1476 or the communication module 1490) in volatile memory 1432, and may process instructions or data stored in the volatile memory 1432 and store the resulting data in nonvolatile memory 1434. According to an embodiment, the processor 1420 may include a main processor 1421 (e.g., a central processing unit or an application processor), and an auxiliary processor 1423, which operates independently from or together with the main processor 1421 (e.g., a graphic processing device, an image signal processor, a sensor hub processor, or a communication processor). Additionally or alternatively, the auxiliary processor 1423 may use less power than the main processor 1421, or may be set to be specific to a specified function. The auxiliary processor 1423 may be implemented separately from, or as part of, the main processor 1421.

The auxiliary processor 1423 may control at least some functions or states associated with at least one of the components of the electronic device 1401 (e.g., the display device 1460, the sensor module 1476, or the communication module 1490), on behalf of the main processor 1421, for example, while the main processor 1421 is in an inactive (e.g., sleep) state, or together with the main processor 1421 while the main processor 1421 is in an active (e.g., application execution) state. According to one embodiment, the auxiliary processor 1423 (e.g., an image signal processor or a communication processor) may be implemented as a part of other functionally related components (e.g., the camera module 1480 or the communication module 1490).

The memory 1430 may store various data to be used by at least one component of the electronic device 1401 (e.g., the processor 1420 or the sensor module 1476). The data may include, for example, input data or output data for software (e.g., the program 1440) and instructions associated therewith. The memory 1430 may include, for example, volatile memory 1432 or nonvolatile memory 1434.

The program 1440 may be stored in the memory 1430 as software, and may include, for example, an operating system 1442, middleware 1444, or application 1446.

The input device 1450 may receive instructions or data for use in a component (e.g., the processor 1420) of the electronic device 1401 from the outside of the electronic device 1401 (e.g., the user). The input device 1450 may include, for example, a microphone, a mouse, or a keyboard.

The sound output device 1455 may output sound signals to the outside of the electronic device 1401. The sound output device 1455 may include, for example, a speaker or a receiver. The speaker may be used for general purposes such as multimedia playback or record playback, and the receiver may be used for receiving incoming calls. According to an embodiment, the receiver may be implemented separately from or as part of the speaker.

The display device 1460 may provide visual information to the outside (e.g., the user) of the electronic device 1401. The display device 1460 may include, for example, a display, a hologram device, or a control circuit for controlling a projector and a corresponding device. According to an embodiment, the display device 1460 may include a touch circuit configured to sense a touch, or a sensor circuit (e.g., a pressure sensor) configured to measure the strength of force of the touch.

The audio module 1470 may convert sound into an electrical signal, or vice versa. According to one embodiment, the audio module 1470 may acquire sound through the input device 1450 or may output sound through the sound output device 1455 or an external electronic device (e.g., the electronic device 1402 (e.g., a speaker or headphone)) connected with the electronic device 1401, either directly or in a wireless manner.

The sensor module 1476 may sense the operating conditions (e.g., power or temperature) of the electronic device 1401 or the external environmental state (e.g., the user state), and may generate an electrical signal or a data value corresponding to the sensed state. According to an embodiment, the sensor module 1476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1477 may support one or more designated protocols that may be used by the electronic device 1401 so as to be directly or wirelessly connected to an external electronic device (e.g., the electronic device 1402). According to one embodiment, the interface 1477 may include, for example, a high definition multimedia interface (HDMI), a universal serial bus (USB) interface, an SD card interface, or an audio interface.

A connection terminal 1478 may include a connector through which the electronic device 1401 may be physically connected to an external electronic device (e.g., the electronic device 1402). According to an embodiment, the connection terminal 1478 may include, for example, an HDMI connector, a USB connector, an SD card connector, or an audio connector (e.g., a headphone connector).

The haptic module 1479 may convert an electrical signal into a mechanical stimulus (e.g., vibration or motion) or an electrical stimulus that may be perceived by the user through a tactile or kinesthetic sense. According to an embodiment, the haptic module 1479 may include, for example, a motor, a piezoelectric element, or an electrical stimulation device.

The camera module 1480 is a device that is capable of capturing, for example, a still image and a video image. According to an embodiment, the camera module 1480 may include one or more lenses, image sensors, image signal processors, or flashes.

The power management circuit 1488 may manage the power to be supplied to the external electronic device 1401. According to an embodiment, the power management module 1488 may be implemented as at least a part of, for example, a power management integrated circuit (PMIC).

The battery 1489 is capable of supplying power to at least one component of the electronic device 1401. According to an embodiment, the battery 1489 may include, for example, a non-rechargeable primary battery, a rechargeable secondary battery, or a fuel cell.

The communication module 1490 may establish a direct (e.g., wired) communication channel or a wireless communication channel between the electronic device 1401 and an external electronic device (e.g., the electronic device 1402, the electronic device 1404, or the server 1408), and may support communication via the established communication channel. The communication module 1490 may include one or more communication processors, which are operated independently from a processor 1420 (e.g., an application processor) and support direct (e.g., wired) communication or wireless communication. According to an embodiment, the communication module 1490 may include a wireless communication module 1492 (e.g., a cellular communication module, a short-range wireless communication module, or a global navigation satellite system (GNSS) communication module) or a wired communication module 1494 (e.g., a local area network (LAN) communication module, or a power line communication module). A corresponding one of these communication modules may communicate with an external electronic device via a first network 1498 (e.g., a short-range communication network such as Bluetooth, Wi-Fi direct, or infrared data association (IrDA)) or a second network 1499 (e.g., a cellular network, the Internet, or a computer network (e.g., a telecommunication network such as a LAN or a WAN)). These various types of communication modules may be integrated into one component (e.g., a single chip) or may be implemented as a plurality of components (e.g., a plurality of chips) that are separate from each other. The wireless communication module 1492 may identify or authenticate the electronic device 1401 in a communication network such as the first network 1498 or the second network 1499 using subscriber information (e.g., an international mobile subscriber identity (IMSI)) stored in a subscriber identification module 1496).

The antenna module 1497 may transmit/receive signals or power to/from the outside (e.g., an external electronic device). According to an embodiment, the antenna module 1497 may include one or more antennas, from which at least one antenna suitable for a communication scheme used in a communication network, such as the first network 1498 or the second network 1499, may be selected by, for example, the communication module 1490. The signals or power may be transmitted or received between the communication module 1490 and the external electronic device via the selected at least one antenna.

Among the components described above, at least some components may be connected to each other via a communication scheme (e.g., a bus, a general-purpose input and output (GPIO), a serial peripheral interface (SPI), or a mobile industry processor interface (MIPI)), and may exchange signals (e.g., commands or data) therebetween.

According to an embodiment, the instructions or data may be transmitted or received between the electronic device 1401 and the external electronic device 1404 via the server 1408 connected to the second network 1499. Each of the electronic devices 1402 and 1404 may be of a type that is the same as or different from that of the electronic device 1401. According to an embodiment, all or some of the operations executed on the electronic device 1401 may be executed on one or more of the external electronic devices 1402, 1404, and 1408. For example, when the electronic device 1401 is to perform a function or service automatically, or in response to a request from a user or another device, the electronic device 1401 may request that one or more external electronic devices perform at least a part of the function or the service, in place of or in addition to performing the function or service by itself. The one or more external electronic devices that receive the request may execute at least a portion of the requested function or service, or an additional function or service associated with the request, and may deliver the result of the execution to the electronic device 1401. The electronic device 1401 may process the result as it is or additionally so as to provide at least a portion of the response to the request. For this purpose, for example, cloud computing technology, distributed computing technology, or client-server computing technology may be used.

According to one embodiment, the electronic device 1401 may include a printed circuit board (e.g., the printed circuit board 340 in FIG. 3), on which at least some of a processor 1420, a memory 1430, an input device 1450, a sound output device 1455, a display device 1460, an audio module 1470, a sensor module 1476, an interface 1477, a haptic module 1479, a camera module 1480, a power management module 1488, a battery 1489, a communication module 1490, a subscriber identification module 1496, and an antenna module 340 are mounted. According to an embodiment, the printed circuit board may include a first printed circuit board (the first printed circuit board 341 in FIG. 3) and at least one second printed circuit board (the second printed circuit board 342 in FIG. 3) disposed to overlap the first printed circuit board. The first printed circuit board or the second printed circuit board may also be formed according to the multilayer printed circuit board manufacturing flow described above with reference to FIGS. 4A, 4B, 4C, and 4D and FIGS. 5A, 5B, 5C, 5D, 5E, and 5F. According to an embodiment, the second printed circuit board is capable not only of reinforcing the first printed circuit board, but also of being utilized as a wiring area.

The term "module" used herein may include a unit implemented with hardware, software, or firmware, and may be used interchangeably with, for example, the terms of "logic," "logic block," "component, "circuit," or the like. The module may be an integrally constructed component or a minimum unit or a part of the component, which performs one or more functions. For example, according to an embodiment, the module may be implemented in the form of an application-specific integrated circuit (ASIC).

Certain embodiments disclosed herein may be implemented by software (e.g., the program 1440) including one or more instructions stored in a storage medium (e.g., internal memory 1436 or external memory 1438) readable by a machine (e.g., the electronic device 1401). For example, a processor (e.g., the processor 1420) of a device (e.g., the electronic device 1401) may call and execute at least one of the stored one or more instructions from a storage medium. This enables the device to be operated to perform at least one function in accordance with the at least one called instruction. The one or more instructions may include code generated by a compiler or code capable of being executed by an interpreter. The machine-readable storage medium may be provided in the form of a non-transitory storage medium. Here, the term "non-transitory" merely means that the storage medium is a tangible device and does not contain a signal (e.g., electromagnetic waves), and this term is not intended to distinguish between the case where data is permanently stored on the storage medium and the case where data is temporarily stored thereon.

According to one embodiment, a method according to certain embodiments disclosed herein may be provided in the manner of being included in a computer program product. A computer program product may be traded between a seller and a purchaser as a commodity. The computer program product may be distributed in the form of a machine-readable storage medium (e.g., a compact disc read only memory (CD-ROM)), or may be distributed through an application store (e.g., Play Store™), directly between two user devices (e.g., smart phones), or online (e.g., downloaded or uploaded). In the case of on-line distribution, at least a part of the computer program product may be temporarily stored in or temporarily produced from a machine-readable storage medium such as a manufacturer's server, a server of an application store, or a memory of a relay server.

According to certain embodiments, among the above-described components, each component (e.g., a module or a program) may include one or more entities. According to certain embodiments, among the components, one or more components or operations may be omitted, or one or more other components or operations may be added. Alternatively or additionally, a plurality of components (e.g., modules or programs) may be integrated into one component. In such a case, the integrated component may perform one or more functions of each of the plurality of components in a manner the same as or similar to performance thereof by the corresponding one of the plurality of components prior to the integration. According to certain embodiments, operations performed by a module, a program, or other components may be performed sequentially, in parallel, repetitively, or heuristically, one or more of the operations may be performed in a different order or omitted, or one or more other operations may be added thereto.

According to an embodiment of the disclosure, an electronic device (e.g., the electronic device 100 in FIG. 1 or 2) may include a first printed circuit board (e.g., the first circuit board 710 in FIG. 7) including a first electrical terminal 701 exposed on one face of a first area (e.g., the first area 711 in FIG. 7), a second electrical terminal 702 exposed on one face of a second area (e.g., the second area 712 in FIG. 7) and not electrically connected to the first electrical terminal 701, and a first ground terminal 705 exposed on one face of a third area (e.g., the third area 713 in FIG. 7) formed between the first area 711 and the second area 712 to have a width narrower than that of the first area 711 or the second area 712. The electronic device 100 may include a second printed circuit board (e.g., the second circuit board 720 in FIG. 7) including a third terminal 703 exposed on one face of a fourth area (e.g., the fourth area 714 in FIG. 7), a fourth electrical terminal 704 exposed on one face of a fifth area (e.g., the fifth area 715 in FIG. 7) and electrically connected to the third electrical terminal 703, and a second ground terminal 706 exposed on one face of a sixth area (e.g., the sixth area 716 in FIG. 7) located between the fourth area 714 and the fifth area 715. The second printed circuit board 720 may be disposed on the first printed circuit board 710 to overlap the third area 713, the first electrical terminal 701 and the third electrical terminal 703 may be electrically coupled to each other, the second electrical terminal 702 and the fourth electrical terminal 704 may be electrically coupled to each other, and the first ground terminal 705 and the second ground terminal 706 may be electrically coupled to each other.

According to an embodiment of the disclosure, the first printed circuit board 710 or the second printed circuit board 720 may be a printed circuit board formed using a copper-clad laminate (CCL) (e.g., FR-4) including an insulating layer in which woven glass fiber impregnated with an epoxy resin is stacked in multiple layers and copper bonded to the insulating layer.

According to an embodiment of the disclosure, the first printed circuit board 710 or the second printed circuit board 720 may be a printed circuit board formed using a copper-clad laminate (e.g., CEM-3) including a center base material made of non-woven glass fiber impregnated with an epoxy resin, outer base materials made of woven glass fiber impregnated with an epoxy resin, and copper foils bonded to the outer base materials.

According to an embodiment of the disclosure, the second printed circuit board may include a multilayer printed circuit board.

According to an embodiment of the disclosure, the second printed circuit board may include a multilayer printed circuit board including inner layers formed on the basis of the copper-clad laminate, and the number of inner layers may be equal to that in the first printed circuit board.

According to an embodiment of the disclosure, the second printed circuit board may include a multilayer printed circuit board including inner layers formed on the basis of the copper-clad laminate, and the number of inner layers may be different from that in the first printed circuit board.

According to an embodiment of the disclosure, the second printed circuit board may include a double-sided printed circuit board.

According to an embodiment of the disclosure, the second printed circuit board may have a thickness different from that of the first printed circuit board.

According to an embodiment of the disclosure, at least a portion of a side face 723 of the second printed circuit board (e.g., the second printed circuit board 720 in FIG. 7) may be surrounded by a conductive material.

According to an embodiment of the disclosure, the third area (e.g., the third area 913 in FIG. 9) may be adjacent to an opening 914 formed in the first printed circuit board 910.

According to an embodiment of the disclosure, the third area (e.g., the third area 913 in FIG. 9) may be adjacent to a camera module 970 included in the electronic device.

According to an embodiment of the disclosure, the electronic device may further include a battery (e.g., the battery 1040 in FIG. 10), and the third area (e.g., the third area 1013 in FIG. 10) may be adjacent to the battery 1040.

According to an embodiment of the disclosure, the electronic device may include a motor mounted on the third area (e.g., the ninth area 919 in FIG. 9).

According to an embodiment of the disclosure, the electronic device may further include a solder (e.g., the solder 841, 842, or 843 in FIG. 8) disposed between the first electrical terminal and the third electrical terminal, between the second electrical terminal and the fourth electrical terminal, or between the first ground terminal and the second ground terminal.

According to an embodiment of the disclosure, at least one of the third electrical terminal, the fourth electrical terminal, and the second ground terminal may include a via.

According to an embodiment of the disclosure, the second printed circuit board may include an antenna (e.g., the antennas 1131 and 1132 in FIG. 11B) disposed on the face facing away from the face that faces the first printed circuit board.

According to an embodiment of the disclosure, the electronic device may further include a communication circuit mounted on the first printed circuit board, and the communication circuit may perform communication using the antenna.

According to an embodiment of the disclosure, the second printed circuit board may be electrically connected to a frequency adjustment circuit mounted on the first printed circuit board.

According to an embodiment of the disclosure, at least a part of the current provided from an external power source connected to the electronic device may flow from the first area to the second area through the second printed circuit board.

According to certain embodiment of the disclosure, an electronic device (e.g., the electronic device 100 in FIG. 1 or 2) may include a first printed circuit board (e.g., the first circuit board 710 in FIG. 7) including a first electrical terminal 701 exposed on one face of a first area (e.g., the first area 711 in FIG. 7), a second electrical terminal 702 exposed on one face of a second area (e.g., the second area 712 in FIG. 7) and not electrically connected to the first electrical terminal 701, and a first metal pad formed on one face of a third area (e.g., the third area 713 in FIG. 7) formed between the first area 711 and the second area 712 to have a width narrower than that of the first area 711 or the second area 712. The electronic device 100 may include a second printed circuit board (e.g., the second circuit board 720 in FIG. 7) including a third terminal 703 exposed on one face of a fourth area (e.g., the fourth area 714 in FIG. 7), a fourth electrical terminal 704 exposed on one face of a fifth area (e.g., the fifth area 715 in FIG. 7) and electrically connected to the third electrical terminal 703, and a second metal pad formed on one face of a sixth area (e.g., the sixth area 716 in FIG. 7) located between the fourth area 714 and the fifth area 715 to have a width narrower than that of the first area 711 or the second area 712. The second printed circuit board 720 may be disposed on the first printed circuit board 710 to overlap the third area 713, the first electrical terminal 701 and the third electrical terminal 703 may be electrically coupled to each other, the second electrical terminal 702 and the fourth electrical terminal 704 may be electrically coupled to each other, and the first metal pad and the second metal pad may be electrically coupled to each other.

The disclosure has been described above in connection with the exemplary embodiments thereof. It will be understood by those skilled in the art to which the disclosure belongs that the disclosure may be implemented in modified forms without departing from the essential characteristics of the disclosure. Therefore, the embodiments disclosed herein should be considered from an illustrative point of view, rather than a limitative point of view. The scope of the disclosure is found not in the above description but in the accompanying claims, and all differences falling within the scope equivalent to the claims should be construed as being included in the disclosure.

What is claimed is:
1. An electronic device comprising:
   a support member;
   a display disposed at a first side of the support member;
   a battery disposed at a second side of the support member opposite to the display;
   a first printed circuit board (PCB) disposed at the second side of the support member; and
   a second PCB,
   wherein the first PCB includes one area having a first width in a first direction and another area having a second width in the first direction, the second width being smaller than the first width,
   wherein, in the first direction, the another area is disposed between an edge of the battery and an edge of the electronic device,
   wherein the second width is reduced from the first width by at least a width of the battery,
   wherein the battery and the another area of the first PCB are disposed adjacent in the first direction such that the battery and the first PCB do not overlap, wherein the first PCB includes a first electrical terminal and a second electrical terminal, wherein the second PCB is stacked with another area of the first PCB to overlap the first electrical terminal and the second electrical terminal and is electrically connected to the first electrical terminal and the second electrical terminal, and wherein the second PCB includes a line connecting the first electrical terminal and the second electrical terminal such that current from the first PCB is provided to the second PCB via the first electrical terminal and the current is provided from the second PCB to the second electrical terminal of the first PCB via the line of the second PCB.

2. The electronic device of claim 1, wherein the line is part of a plurality of second lines extending from the first electrical terminal to the second electrical terminal via the second PCB for transmission of data and/or electrical power from the first electrical terminal to the second electrical terminal through the second PCB, and/or wherein the first PCB includes a plurality of first lines extending from the first electrical terminal to the second electrical terminal via the first PCB.

3. The electronic device of claim 2, wherein the first lines and the second lines jointly form an electric connection between the first electrical terminal and the second electrical terminal.

4. The electronic device of claim 3, wherein a first electronic component mounted on the one area and a second electronic component mounted on the another area are electrically connected via the second PCB by the line.

5. The electronic device of claim 1, wherein the second PCB is electrically connected to the first electrical terminal and the second electrical terminal by soldering elements, respectively, and wherein the line extends from the first electrical terminal to the second electrical terminal via the soldering elements and the second PCB.

6. The electronic device of claim 1, wherein the first electrical terminal and the second electrical terminal are disposed on a top layer of the first PCB, and wherein a bottom layer of the second PCB is directly coupled by solder or via a plurality of soldering elements to the first electrical terminal and the second electrical terminal.

7. The electronic device of claim 1, wherein the first electrical terminal is disposed in the another area, and wherein the second electrical terminal is disposed in the another area.

8. The electronic device of claim 1, wherein the one area includes a first area and/or a second area spaced apart from the first area, and wherein the another area includes a third area connecting the first area and the second area.

9. The electronic device of claim 8, wherein a width of the first area in the first direction is at least equal to a sum of the width of the battery and a width of the third area in the first direction, and/or wherein a width of the second area is between the width of the battery and the width of the third area in the first direction.

10. The electronic device of claim 8, wherein, in a second direction perpendicular to the first direction in a plane, the first area is located adjacent to a top edge of the electronic device and the second area is located adjacent to a bottom edge of the electronic device.

11. The electronic device of claim 1, wherein the battery and the first PCB overlap in a plane extending perpendicularly to a front face of the electronic device.

12. The electronic device of claim 1, wherein communication chips are mounted on the first PCB.

13. The electronic device of claim 1, wherein the first PCB and the second PCB include a multilayer printed circuit board including inner layers formed on a basis of a copper-clad laminate.

14. The electronic device of claim 1, wherein the second PCB is configured to reinforce the first PCB.

* * * * *